US011515319B2

(12) United States Patent
Cheng et al.

(10) Patent No.: US 11,515,319 B2
(45) Date of Patent: Nov. 29, 2022

(54) SEMICONDUCTOR MEMORY STRUCTURE AND MANUFACTURING METHOD THEREOF

(71) Applicant: Macronix International Co., Ltd., Hsinchu (TW)

(72) Inventors: Chen-Yu Cheng, Taipei (TW); Tzung-Ting Han, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 113 days.

(21) Appl. No.: 16/867,063

(22) Filed: May 5, 2020

(65) Prior Publication Data

US 2021/0351196 A1  Nov. 11, 2021

(51) Int. Cl.
| | |
|---|---|
| H01L 27/11582 | (2017.01) |
| H01L 27/1157 | (2017.01) |
| H01L 23/00 | (2006.01) |
| H01L 27/11556 | (2017.01) |
| G11C 5/02 | (2006.01) |
| H01L 27/06 | (2006.01) |

(52) U.S. Cl.
CPC ........ *H01L 27/11556* (2013.01); *G11C 5/025* (2013.01); *H01L 27/0688* (2013.01); *H01L 27/11582* (2013.01)

(58) Field of Classification Search
CPC ........... H01L 27/11556; H01L 27/0688; H01L 27/11582; H01L 27/11573; H01L 27/11575; H01L 24/09; H01L 24/17; H01L 24/49; H01L 24/73; H01L 24/81; H01L 24/05; H01L 24/08; H01L 24/80; H01L 24/92; H01L 24/48; H01L 24/82; H01L 24/85

See application file for complete search history.

(56) References Cited

U.S. PATENT DOCUMENTS

| | | | | |
|---|---|---|---|---|
| 9,576,967 | B1 * | 2/2017 | Kimura | ............. H01L 27/11582 |
| 9,721,663 | B1 * | 8/2017 | Ogawa | ................ H01L 23/5226 |
| 9,960,181 | B1 * | 5/2018 | Cui | .................... H01L 29/40117 |

(Continued)

FOREIGN PATENT DOCUMENTS

| | | | | |
|---|---|---|---|---|
| CN | 108377660 | | 8/2018 | |
| CN | 108431956 A | * | 8/2018 | ......... G11C 16/0483 |

(Continued)

*Primary Examiner* — Mary A Wilczewski
*Assistant Examiner* — Tsz K Chiu
(74) *Attorney, Agent, or Firm* — Fish & Richardson P.C.

(57) ABSTRACT

Methods and apparatus for fabricating memory devices are provided. In one aspect, an intermediate stack of dielectric layers are formed on a first stack of dielectric layers in a first tier. The intermediate stack of dielectric layers is then partially or fully etched and have a landing pad layer deposited thereon. In response to planarizing the landing pad layer to expose a top surface of the intermediate stack of dielectric layers, a second stack of dielectric layers are deposited above the planarized landing pad layer. A staircase is formed by etching through the second stack, the intermediate stack, and the first stack of dielectric layers in the staircase region of the memory device. The staircase is located adjacent to one end of the center landing pad, where steps of the staircase are formed within the thickness of the center landing pad.

15 Claims, 18 Drawing Sheets

(56) References Cited

U.S. PATENT DOCUMENTS

| | | | |
|---|---|---|---|
| 10,381,362 B1 * | 8/2019 | Cui | .................. H01L 21/76805 |
| 10,580,783 B2 | 3/2020 | Cui et al. | |
| 10,714,497 B1 * | 7/2020 | Nishida | ............. H01L 29/40117 |
| 10,847,523 B1 * | 11/2020 | Yeh | .................. H01L 27/11507 |
| 2011/0316072 A1 * | 12/2011 | Lee | ...................... H01L 23/528 |
| | | | 257/E27.06 |
| 2017/0062454 A1 * | 3/2017 | Lu | ...................... H01L 21/76877 |
| 2017/0179026 A1 * | 6/2017 | Toyama | ............ H01L 21/76802 |
| 2019/0371807 A1 | 12/2019 | Nishikawa et al. | |
| 2020/0286875 A1 * | 9/2020 | Nishida | ................... H01L 24/09 |
| 2020/0312863 A1 * | 10/2020 | Iwai | ................. H01L 27/11524 |
| 2021/0202496 A1 * | 7/2021 | Nam | ................ H01L 27/11573 |

FOREIGN PATENT DOCUMENTS

| | | | | |
|---|---|---|---|---|
| WO | WO 2017/034646 | | 3/2017 | |
| WO | WO-2017034649 A1 * | | 3/2017 | ....... H01L 21/32055 |
| WO | WO2017112014 A1 | | 6/2018 | |
| WO | WO 2019/052127 | | 3/2019 | |

* cited by examiner

SEMICONDUCTOR MEMORY STRUCTURE AND MANUFACTURING METHOD THEREOF

TECHNICAL FIELD

This disclosure relates in general to a semiconductor memory structure and a manufacturing method thereof.

BACKGROUND

In recent years, the storage capacity of semiconductor memory devices has been continuously increasing and the structures of such memory devices have been constantly changing. The demand for memory devices focuses on small size and large memory capacity. To satisfy this requirement, three-dimensional (3D) memory devices, e.g., 3D NAND flash memory devices, have been extensively explored to achieve increased memory cell density with competitive cost. To fabricate a 3D NAND flash memory device, advanced word lines patterning is currently used, with repeated staircase etching and hard mask trimming processes, to produce a staircase for the word line contacts in the memory device.

SUMMARY

The present disclosure describes methods for fabricating a memory device. The memory device includes a periphery region, a staircase region and a plurality of memory cells located in a first tier of a memory array region. One of the methods for fabricating of the memory device starts from forming an intermediate stack of dielectric layers on a first stack of dielectric layers in the above noted regions of the memory device. Following that, one or more dielectric layers of the intermediate stack of dielectric layers are etched on which a landing pad layer is deposited. The landing pad layer is located over the etched intermediate stack of dielectric layers and in the periphery region, the staircase region and the memory array region of the memory device. In a next step, the deposited landing pad layer is planarized so as to expose a top surface of the intermediate stack of dielectric layers and to form a center landing pad. The method further includes forming a second stack of dielectric layers above the center landing pad, and etching through the second stack, the intermediate stack, and the first stack of dielectric layers to form a staircase in the staircase region of the memory device. As described in the detailed descriptions, the first stack, the second stack, and the intermediate stack of dielectric layers include alternating dielectric layers of different composition.

Additionally, the present disclosure describes memory devices that include a memory array region, a center landing pad, a staircase region and a periphery region. In an example memory device, the memory array region includes a plurality of tiers that are vertically arranged. Each of the plurality of tiers includes a plurality of memory cells and a plurality of word lines that are respectively coupled to the plurality of memory cells. The center landing pad is located between two adjacent tiers of the plurality of tiers. Moreover, the staircase region of the memory device includes a staircase located adjacent to one end of the center landing pad and a plurality of conductive pillars connected with the staircase. Specifically, there are one or more steps of the staircase that are formed within a thickness of the center landing pad. The periphery region of the memory devices includes multiple stacks of dielectric layers and a plurality of via contacts penetrating downwards through the multiple stacks of dielectric layers.

Furthermore, the present disclosure describes memory devices including a periphery region that includes multiple stacks of dielectric layers and a memory array region that includes a plurality of tiers vertically arranged. The memory array region includes a plurality of memory cells and a plurality of word lines that are coupled to the plurality of memory cells, respectively. The memory device also includes a staircase region with a staircase fabricated therein. The staircase includes portions of the plurality of word lines that extend from the memory array region of the memory device. In particular, the memory device includes a center landing pad located between the plurality of tiers in the memory array region. In this configuration, a top surface and a bottom surface of the center landing pad are coplanar with two respective transition interfaces between dielectric layers in the periphery region of the memory device.

A further aspect of the present disclosure features that the dielectric layers include one of a pair of silicon oxide and silicon nitride layers, a pair of silicon oxide and poly silicon layers, a pair of silicon nitride and poly silicon layers, a pair of silicon oxide and tungsten layers, or a tuple of silicon oxide, silicon nitride, and poly silicon layers. In some cases, the center landing pad of the memory device has a thickness that equates to a sum of thicknesses of one or more consecutive dielectric layers in the periphery region of the memory device.

For illustrative purposes, the following description pertains to the staircase for 3D memory devices and a related method of manufacture. This disclosure may be applied to 3D NAND memory devices with a floating-gate (FG) or a charge-trap (CT) gate. Additionally, the 3D memory devices may have various configurations including CMOS under the memory array (CUA) and CMOS near the memory array (CNA).

The details of one or more embodiments are set forth in the accompanying drawings and the description below. Other aspects, features and advantages will be apparent from the description, the drawings, and the claims.

BRIEF DESCRIPTION OF THE DRAWINGS

FIG. 2b is a schematic cross-sectional side view of a zoomed in memory array region of the memory device in FIG. 2a.

Like reference numbers and designations in the various drawings indicate like elements. It is also to be understood that the various exemplary implementations shown in the figures are merely illustrative representations and are not necessarily drawn to scale.

Figure 1:
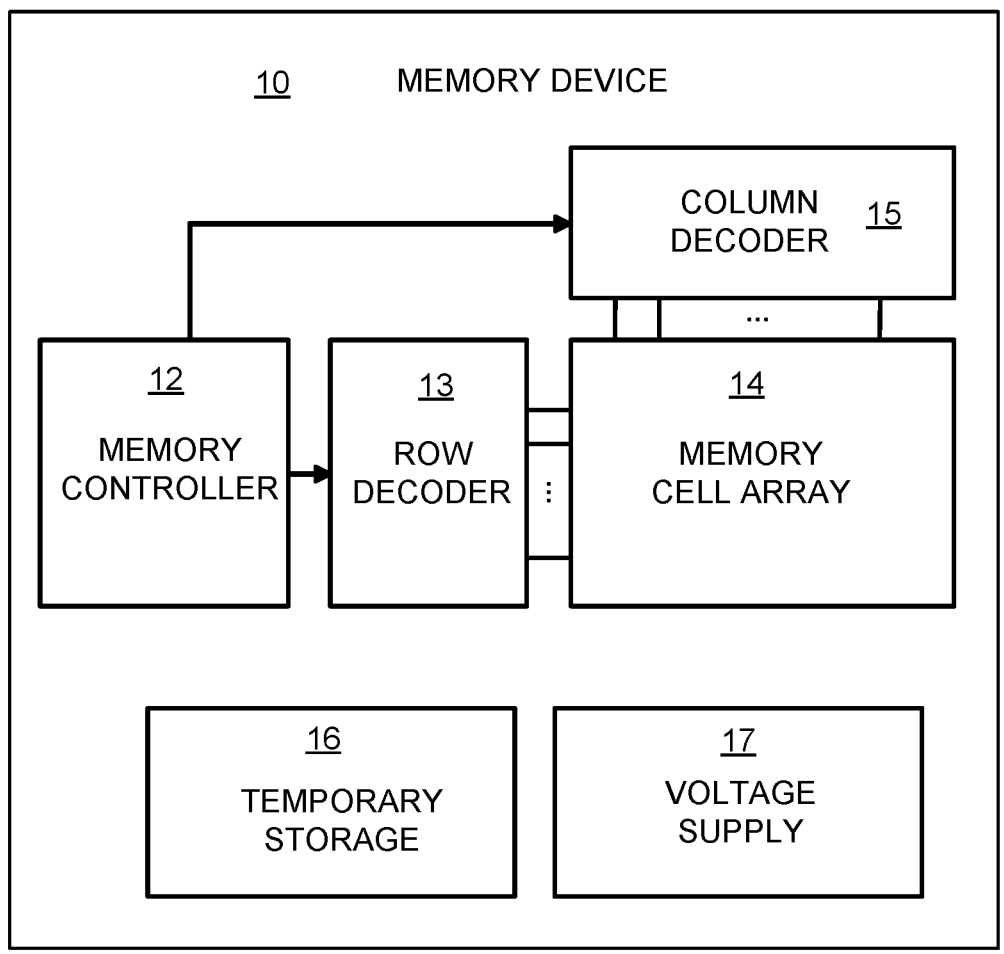
FIG. 1 illustrates an example memory device.

DETAILED DESCRIPTION 3D memory devices increase memory density without shrinking the size of individual memory cells by vertically stacking multiple layers of memory arrays. In a 3D memory device, the edges of the word lines of the memory arrays are processed by repeating etching and resist trimming on the stack of multiple layers to form a staircase. The staircase provides contacts between the memory cells and vertical interconnections in the 3D memory device and is configured to connect the memory cells to the circuitry under array for data reading, writing and erasing.

In order to connections between bit line circuitry and the memory cells, vertical memory channels are formed through the stack of layers. In particular, memory cell holes are etched and filled to form the memory channels. However, at a sufficiently large number of layers, it becomes difficult to etch the memory cell holes through the stack of layers. To address this problem, one or more center landing pads can be provided in between separate tiers of layers in the 3D memory device. Such landing pads serve as etch stop layers between the tiers during the etch of the memory cell holes.

Unfortunately, the introduction of multiple tiers of memory array layers and center landing pads creates further challenges during fabrication of the 3D memory devices. In particular, it is difficult to precisely control the staircase formation because of non-uniform etch selectivity introduced by the center landing pad material and other materials in the 3D memory devices.

This disclosure presents a method and structure in which a staircase can be fabricated across a multi-tier 3D memory device in a single sequence of etch and trim steps. Specifically, this disclosure defines a position and thickness of the center landing pad by depositing one or more pairs of dielectric stack layers on top of a first tier of layers of the memory array. The deposited pairs of dielectric stack layers are patterned, filled and planarized. Thus, the etched away portion of the pairs of dielectric stack layers is filled to define the center landing pad. A second tier of layers of the memory array is then fabricated on the planarized center landing pad with similar memory cells to that of the first tier memory array.

In this disclosure, the staircase can be formed through multiple tiers by a single section process. This single section process includes multiple cycles of trimming and etching on the opened staircase region of the multi-tier memory device. The location and thickness of the center landing pad can be precisely controlled so that the center landing pad is embedded in the dielectric stack layers and not exposed during the single section staircase process. That is, the staircase etch process only etches the dielectric stack layers of the multi-tiers memory device. Consequently, uniform staircase at edges of the word lines can be generated for contact formation in the 3D memory device.

In addition, this disclosure provides a simplified integration flow for generating a multi-tier memory device with a single section staircase formation, which can reduce the cost of the memory device.

FIG. 1 illustrates an example memory device 10. The memory device 10 includes a memory controller 12 and a memory cell array 14. The memory controller 12 includes hardware and software logic to perform various operations, which include programming the memory cell array 14, e.g., writing to, reading from, or erasing from the memory cell array 14. In some implementations, the memory controller 12 includes one or more processors to program memory cells in the memory cell array 14. For example, the memory controller 12 can execute operations to program the memory cell array 14. The operations can be stored in a storage accessible by the memory controller 12. In some implementations, the operations can be stored at a flash memory or a hard disk. In some implementations, the operations can be stored at a temporary storage. In some implementations, the operations can be stored in a dedicated portion of the memory cell array 14 that is distinct from the memory cells that are to be programmed.

The memory cell array 14 includes one or more memory blocks. In some implementations, each of the memory blocks may include a plurality of memory cell strings. A string can include a plurality of memory cells. The memory cells can be single-level cells or multi-level cells. In some implementations, the memory cell array 14 includes non-volatile memory cells, e.g., a flash memory cells. However, the memory cell array 14 can include any type of 3D memory cells including, but not limited to, 3D NAND flash memory cells comprising U-shaped strings, and 3D NAND flash memory cells comprising non-U-shaped strings. In some implementations, each of the memory blocks may include a single string.

The memory device 10 includes a row decoder 13 and a column decoder 15. In some implementations, the row decoder is coupled to a plurality of word lines that are arranged in a first direction in the memory cell array 14 and the column decoder 15 is coupled to a plurality of bit lines that are arranged in a second direction in the memory cell array 14. In some other implementations, the row decoder is coupled to a plurality of bit lines that are arranged in a first direction in the memory cell array 14 and the column decoder 15 is coupled to a plurality of word lines that are arranged in a second direction in the memory cell array 14.

The memory controller 12 can control reading or programming operations to one or more memory cells in the memory cell array 14 using the row decoder 13 or the column decoder 15. In some implementations, the memory controller 12 provides addresses to the row decoder 13 and the column decoder 15 to perform reading or programming operations to one or more particular memory cells in the memory cell array 14. In some other implementations, addresses can be provided from an external device or an external circuit to the row decoder 13 and the column decoder 15 to perform reading or programming operations to one or more particular memory cells in the memory cell array 14.

In some implementations, the memory device 10 includes a voltage supply 17. The memory controller 12 controls the voltages supply 17 to provide power for the memory cell array 14. The memory controller 12 can perform read and programming operations using power provided from the voltage supply 17.

In some implementations, the memory device 10 can further include a temporary storage 16 to store information for programming memory cells in the memory cell array 14. The information can include different voltages levels, and timing data to define the times during which the different voltage levels are applied to the memory cell array. A variety of formats are possible for the timing data for the different voltage level to be applied to the memory cell array, e.g., a start time and an end time for a particular voltage level, or a start time and a duration for the particular voltage level. The temporary storage 16 can be any type of suitable storage. For example, the temporary storage 16 can be static random access memory (SRAM), NAND flash memory, or a set of registers. In some implementations, the temporary storage 16 can be implemented as a portion of the memory cell array 14, which can be distinct from the memory cells that are to be programmed.

Figure 2A:
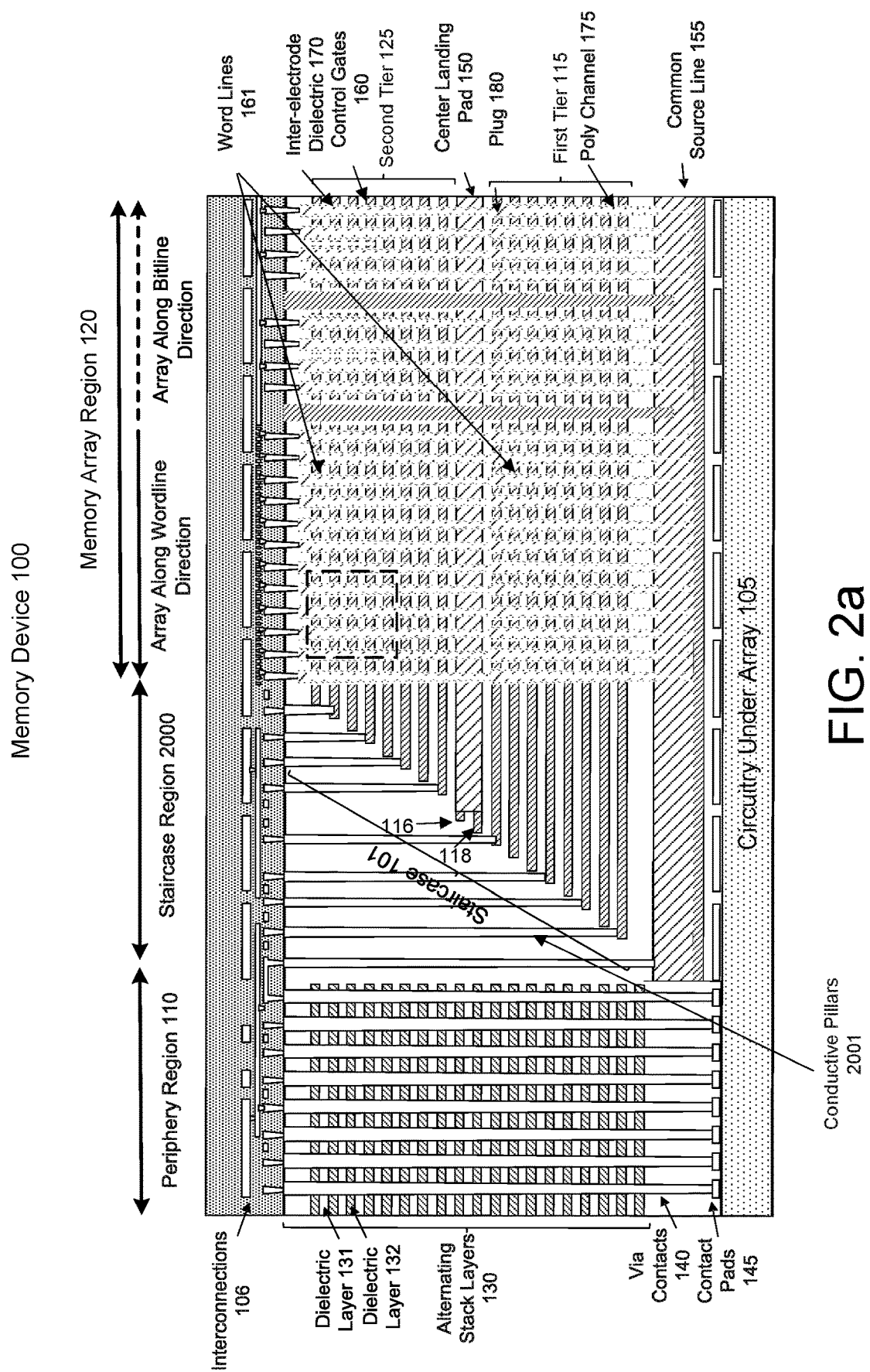
FIG. 2a is a schematic cross-sectional side view of a portion on an example semiconductor memory device.

Referring more particular to the drawings, FIG. 2a is a schematic that illustrates a cross-sectional side view of an example of a portion of a memory device 100. The memory device 100 can provide the memory cell array 14 of FIG. 1.

The memory device 100, in the present example, includes a periphery region 110, a staircase region 2000 and a memory array region 120. The memory device 100, in the present example, includes a sub-array circuit, e.g., a circuitry under array 105, disposed on a substrate in the periphery region 110, the staircase region 2000 and the memory array region 120. The memory device 100 also includes interconnections 106 including bit lines which are located over the substrate in the periphery region 110, the staircase region 2000 and the memory array region 120. In this example, a plurality of contact pads 145 are located on a top surface of the circuitry under array 105. The interconnections 106 can be connected to contact pads 145 of the circuitry under array 105 by via contacts 140 that extend through alternating stack layers 130 in the stack films portion of the periphery region 110. In another example, the sub-array circuit is not under memory array, but near the memory array.

The memory array region 120, as shown in FIG. 2a, includes a plurality of word lines 161 arranged in parallel and spaced apart along the memory array stacking direction. The word lines 161 are in contact with the memory cells acting as control gates 160 in the memory array region 120. The word line direction and bit line direction are orthogonal in the memory device 100.

In this example, the memory array region 120 includes vertical channel memory cells for better electrostatic control and a greater on-current provided by a larger effective gate width. As described later in this disclosure, the memory cells are fabricated by depositing a stack of alternating dielectric films and then forming cell holes all the way through the stack of films. The stack of alternating dielectric films may include a number of paired films, e.g., each pair can include a dielectric layer and a sacrificial layer for replacement gate formation. The cell holes may be formed by a high aspect ratio etch in order to make room to form an inter-electrode dielectric 170 and a channel layer 175 therein.

FIG. 2a shows a two-tier memory array that includes a center landing pad 150 disposed between a first tier 115 and a second tier 125 of the memory array layers. The center landing pad 150 acts as an etch stop layer for the formation of memory cell holes in the second tier 125. The center landing pad may be formed from various materials, e.g., polysilicon, tungsten, silicon nitride, silicon oxide, silicon oxynitride, high-K dielectric materials, and silicide (e.g., CoSi, TiSi, or NiSi), among other materials. In some implementations, the memory array region 120 may include horizontal channel memory cells which give a smaller effective memory cell area.

The memory device 100 includes word lines 161 presented as a plurality of gate layers for the memory cells in the memory array region 120. The word lines 161 are separated by an inter layer dielectric material, e.g., silicon oxide, and electrically connect each of the memory cells in the memory array region 120 with the circuitry under array 105 and interconnections 106.

For 3D NAND memory operations, the memory cells are accessed through the word lines 161 and bit lines. Next to the memory array region 120, the memory device 100 includes a periphery region 110 that includes electrical connections for reading from and writing to the memory cells of the memory device 100. As shown in FIG. 2a, the staircase structure 101 is formed at one end of the word lines 161. Conductive pillars 2001 extend from the interconnections 106 to the end of the word lines 161. The interconnections 106 are located on a top portion of the memory device 100. In this example, the plurality of interconnections 106 connect the contact openings, e.g., via contacts 140, extend through and are electrically insulated within an alternating stack layer 130, and are configured to provide interconnection between the memory cells and circuitry under array 105 of the memory device 100. As shown in FIG. 2a, the via contacts 140 extend through the multiple stack of dielectric layers in the periphery region 110 and connect the interconnections 106 to the contact pads 145. The via contacts 140 may be formed of metals, metal silicide, or other materials. The interconnections 106 may be formed of conductive materials, e.g., metals.

Figure 2B:
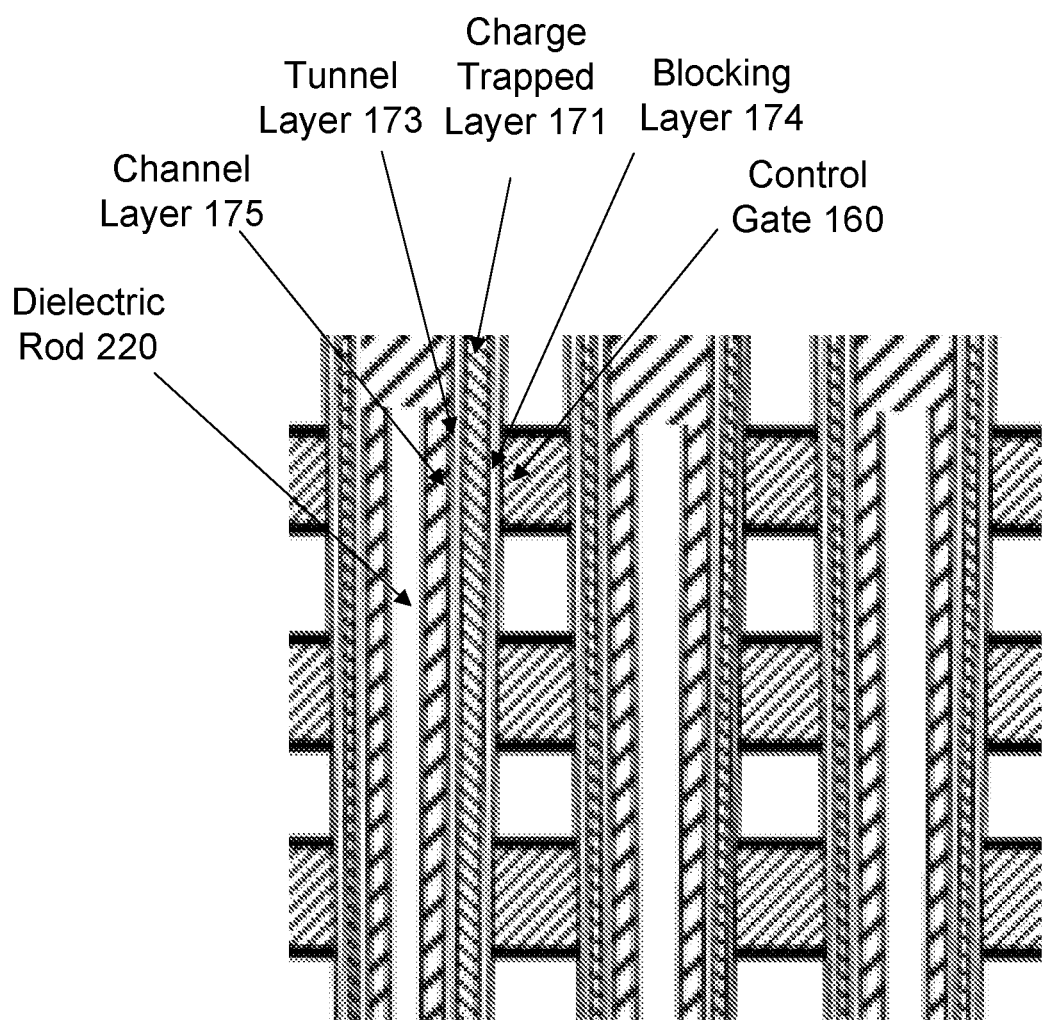

The gate electrode of each memory cell, as shown in zoomed in area of the memory array region in FIG. 2b, includes an inter-electrode dielectric 170 fabricated by inserting a charge trapped layer 171 between two electrode layers (a control gate 160 and a channel layer 175). In this example, a blocking layer 174, e.g., a high-K material layer, is inserted between the control gate 160 and the charge trap layer 171 to prevent electron injection from the control gate 160 into the charge trap layer 171 during erase operation. Charge retention and endurance characteristics of the memory cell could keep in good condition. Meanwhile, a tunnel layer 173, e.g., an oxide layer, is inserted between the charge trap layer 171 and the channel layer 175 to serve as a tunnel barrier for carrier.

In this example, as shown in FIG. 2a, the staircase 101 of the memory device 100 includes one or more steps that are located adjacent to one end of the center landing pad 150. As shown in FIG. 1, there are two steps 116 and 118 that are formed within the thickness of the center landing pad 150, i.e., between the top and bottom plane of the center landing pad 150. The thickness of the center landing pad 150 is equal to a sum of thicknesses of one or more consecutive dielectric layers in the periphery region 110. As an example, the thickness of the center landing pad 150 is equal to a sum of thicknesses of an integer number of consecutive pairs of alternating dielectric layers 131 and 132, plus the thickness of an additional dielectric layer 132. For example, the thickness of the center landing pad 150 is equal to a sum of thicknesses of three consecutive dielectric layers in the intermediate stack of dielectric layers 310. The steps 116 and 118 are isolated by the dielectric layer 131, e.g., a silicon oxide layer. These two steps are not electrically connected to the vertically aligned via contacts 140 because they do not contact any conductive pillar 2001 in the staircase region 2000 to the interconnections 106.

The memory device 100 includes circuitry under array 105 at the bottom of the memory device 100. The circuitry under array 105 may perform functions including memory cell row and column decoding, bit lines precharge logic reading, sensing amplifiers, and timing control. The circuitry under array 105 can be fabricated on a substrate (not shown here) by front-end-of-line (FEOL) CMOS processes. As shown in FIG. 2a, the via contacts 140 connect the circuitry under array 105 to the interconnections 106.

Figure 3:
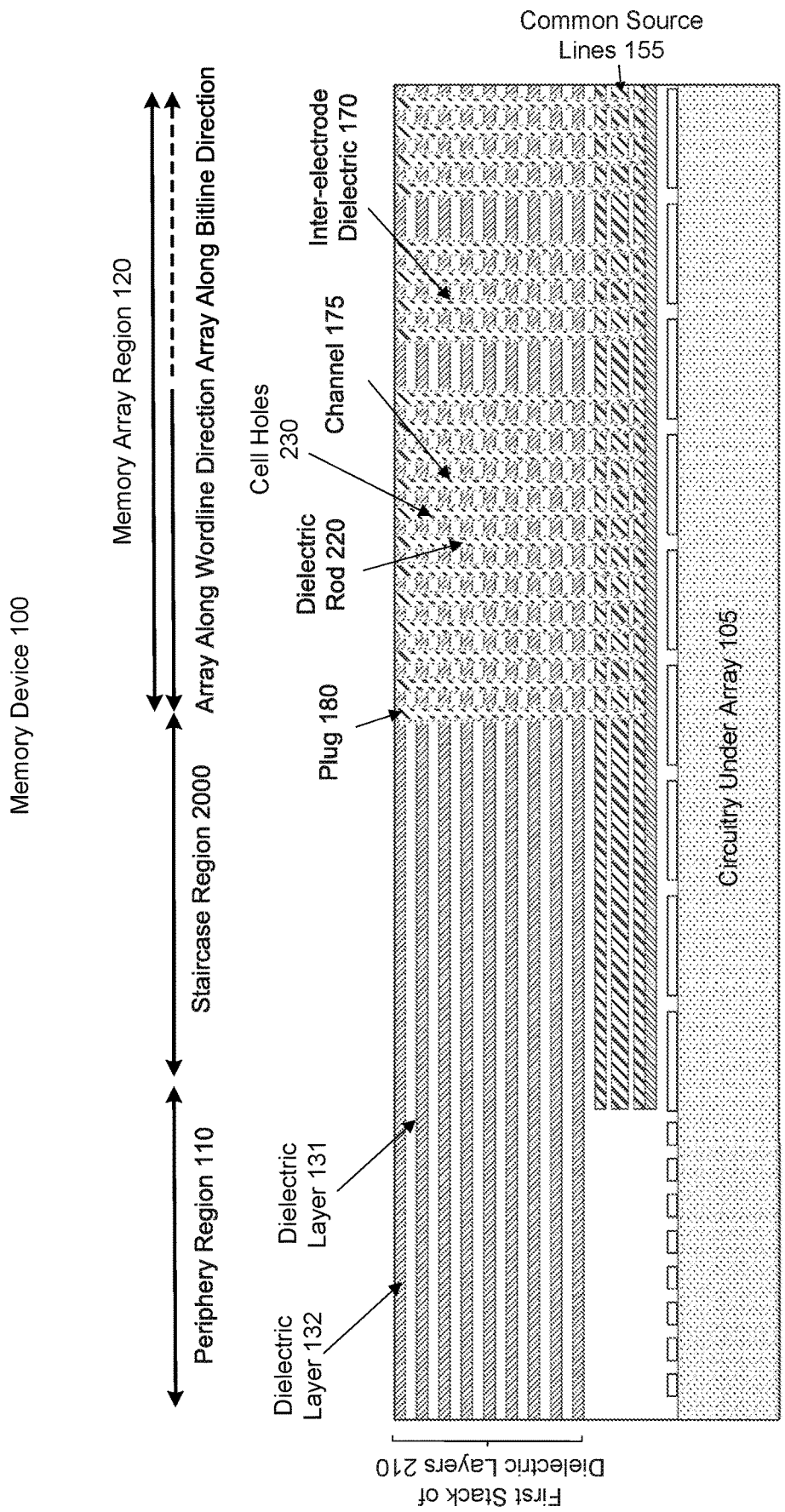
FIGS. 3-17 are schematic cross-sectional side views that illustrate an example manufacturing process for the example semiconductor memory shown in FIG. 1.

The memory device 100 also includes common source lines 155 located under the plurality of memory cells and connected to the plurality of memory cells. The common source lines 155 may be connected to a number of memory cells to couple their control gates 160 to a number of word lines 161, for a purpose of reducing the size of the memory device 100. The common source lines 155 may be provided by one or more conductive materials, e.g., polysilicon, tungsten, aluminum, copper, and other materials. The fabrication of the memory device 100 involves significant challenges such as controlling of multi-step patterning procedures for etching the staircase as well as forming memory cell holes with extremely high aspect ratio etch landing on small steps. FIGS. 3-17 are cross-sectional side views of the example memory device 100 shown in FIGS. 2a and 2b, to present the fabrication process for manufacturing the memory device. FIG. 3 is a schematic that illustrates a cross-sectional side view of a portion of the example memory device 100 according to the present disclosure. The memory device 100 includes a memory array region 120, the staircase region 2000 and a periphery region 110. In the memory array region 120, the cross sectional view of array cut along word line direction (array along word line direction) and the cross sectional view of array cut along bit line direction (array along bit line direction) are shown. The memory device 100 includes a plurality of common source lines 155 located above the circuitry under array 105. The common source lines 155 are extend laterally in parallel and are separated by dielectric layer 131, e.g., silicon oxide, for electrical isolation.

A first stack of dielectric layers 210 is deposited over the circuitry under array 105. The first stack of dielectric layers 210 includes pairs of alternating dielectric layers 131 and 132, of different composition, e.g. alternating oxide and nitride layers, e.g. alternating silicon oxide and silicon nitride films. The pairs of dielectric layers 131, 132, e.g., the silicon oxide and silicon nitride films, may be repeatedly deposited, e.g., 96 times to generate 96 pairs of layers in the first dielectric layer stack. One layer from the pair of layers, e.g., the lower dielectric layer 131, e.g., the silicon oxide film, provides mechanical support and dielectric isolation for memory device components. The other layer from the pair of layers, e.g., the upper dielectric layer 132, e.g., the silicon nitride film, serves a sacrificial layer which will be later removed for replacement gate formation.

In this example, the thickness of the alternating dielectric films determines the gate length of the memory cell in the memory device 100, and may be in a range from 5 nm to 50 nm. Any defect or small variation in film thickness can result in a large deviation of the memory array, leading to a poor device performance. Therefore, highly uniform and smooth deposition, layer-to-layer precision and adhesion may be required. In addition, the alternative dielectric film stress management becomes critical and more challenging with increasing the number of stacked layers. In some implementations, the first stack of dielectric layers 210 may include silicon oxide and poly silicon layers, silicon nitride and poly silicon layers, silicon oxide and tungsten layers, and silicon oxide, silicon nitride and poly silicon layers, and other layers.

In the memory array region 120 of the memory device 100, vertical cell holes 230 are etched through the first stack of dielectric layers 210 to create space for memory cell formation and vertical electrical connections between the memory layers. The vertical cell holes may be formed by a high aspect ratio directional etch (e.g., a RIE etch). Once the cell holes are etched, an inter-electrode dielectric 170, e.g., silicon oxide-silicon nitride-silicon oxide multi layer, is then deposited conformally on the side wall and bottom surface of the cell holes. With this configuration, conductive vertical channels 175, e.g., formed of polysilicon, are deposited along the internal surface of the inter-electrode dielectric 170. A gap remaining between the vertical channels 175 can be filed by a dielectric rod 220, e.g., a silicon oxide. A plug 180, e.g., polysilicon, is formed on an upper surface of each cell hole. The plug 180 is conductive and is capped on the top portion of the polysilicon channel layer 175 so as to provide electrical connection between the lower first tier of memory cells and an upper second tier. Additionally, the plug 180 serves as an etch stop to protect the first tier of memory cells from vertical cell holes etchings during fabrication of the second tier memory cells.

Figure 4:
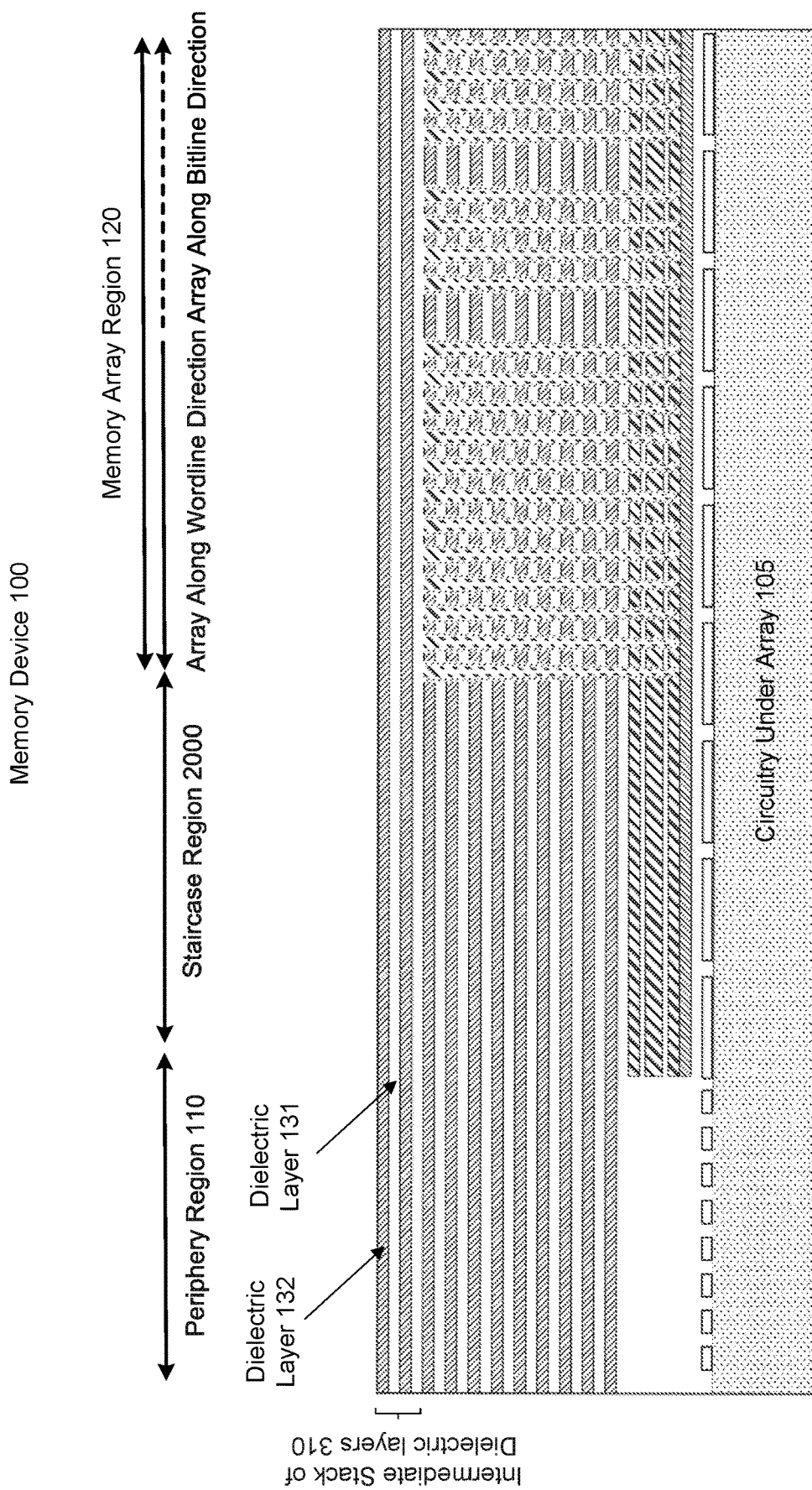

FIG. 4 is a schematic that illustrates a cross-sectional side view of a portion of the example memory device 100 after forming an intermediate stack of dielectric layers 310 on the first stack of dielectric layers 210 in the periphery region 110, the staircase region 2000, and the memory array region 120. In this example, the intermediate stack of dielectric layers 310 may be deposited and the memory array region 210 includes a plurality of memory cells in the first tier 115. The intermediate stack of dielectric layers 310 includes one or more pairs of dielectric layers 131 and 132. Each pair of dielectric layers in the intermediate stack of dielectric layers 310 includes alternating layers, e.g., an upper dielectric layer 132 and a lower dielectric layer 131 of different composition. The intermediate stack of dielectric layers 310 could include two pairs of silicon oxide and silicon nitride layers that are alternately deposited on top of the structure shown in FIG. 3 in the memory array region 120, the staircase region 2000, and the periphery region 110. In other implementations, various pairs of stack layers with similar alternating structure to that of the intermediate stack of dielectric layers 310 may be deposited, including one pair of silicon nitride and silicon oxide layers plus a silicon oxide layer on top; two pairs of silicon nitride and silicon oxide stack layers; two pairs of silicon nitride and silicon oxide stack layers plus a silicon nitride layer on top; and two pairs of silicon nitride and silicon oxide stack layers plus a polycrystalline silicon layer located in between the two pairs of stack layers. A total thickness of the intermediate stack of dielectric layers 310 will vary according to number of pairs of dielectric layers and the thickness of each of the layers. The intermediate stack of dielectric layers 310 will define the thickness of the subsequently fabricated landing pad.

The intermediate stack of dielectric layers 310 can be deposited by a Chemical Vapor Deposition (CVD) technique or an Atomic Layer Deposition (ALD) technique to achieve a film stack includes alternating layers of different composition similar to the first stack of dielectric layers 210 and the second stack of dielectric layers 810 which would be formed later.

Figure 5:
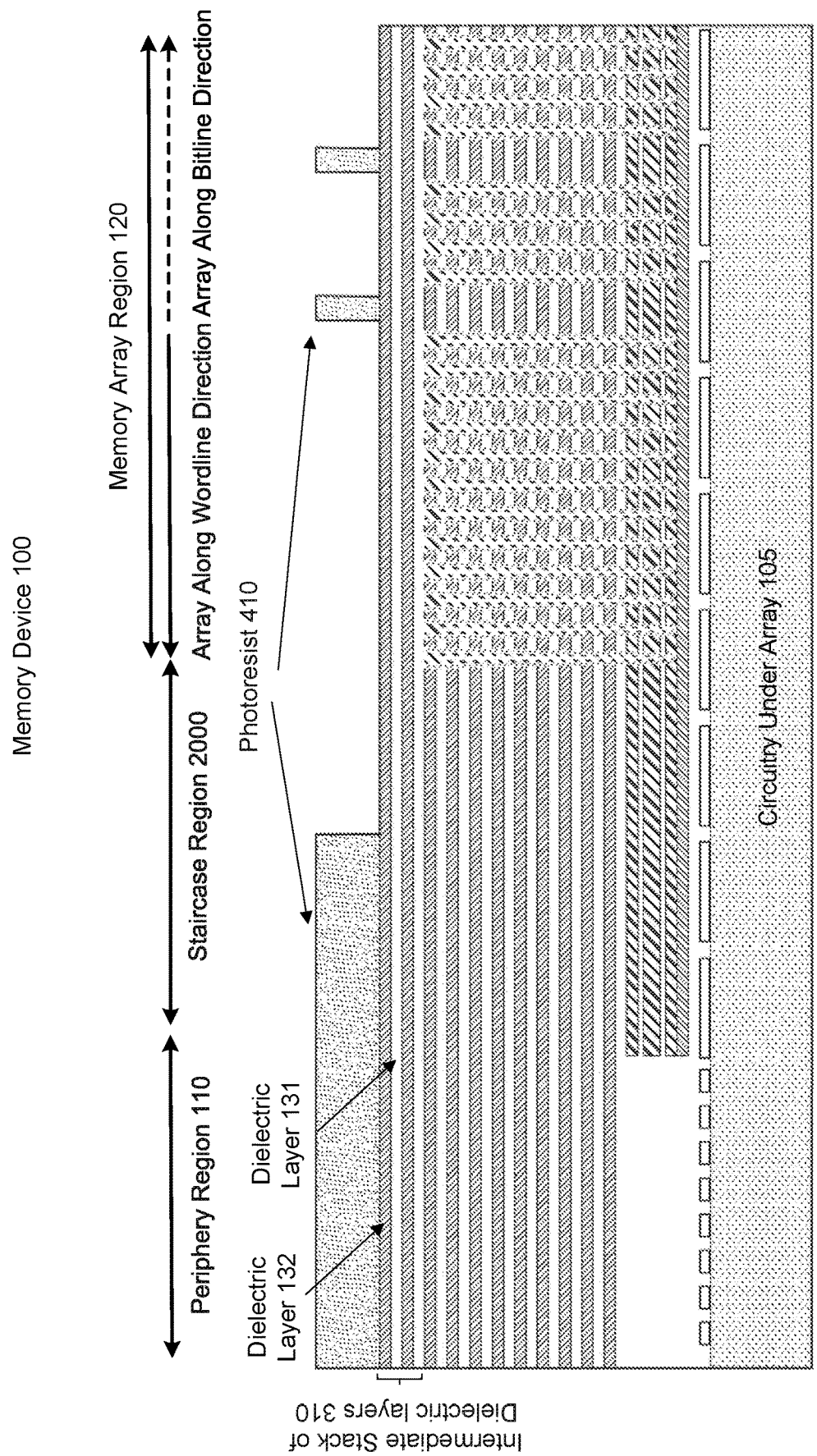

FIG. 5 is a schematic that illustrates a cross-sectional side view of a portion of the example memory device 100 after photolithography. A photoresist 410 is deposited and patterned on a top surface of the intermediate stack of dielectric layers 310 of the memory device 100. After exposure to UV light, the photoresist 410 is baked and developed and used as a mask during etching to transfer a pattern from a lithography mask to the intermediate stack of dielectric layers 310. In particular, a portion of the photoresist 410 is removed to expose the intermediate stack of dielectric layers 310 in the memory array region 120 and the staircase region 2000 to define spaces for the center landing pad. Portions of the photoresist 410 can remain over the staircase region 2000 and over some areas of the memory array region 120 to enable subsequent slits formation.

Figure 6:
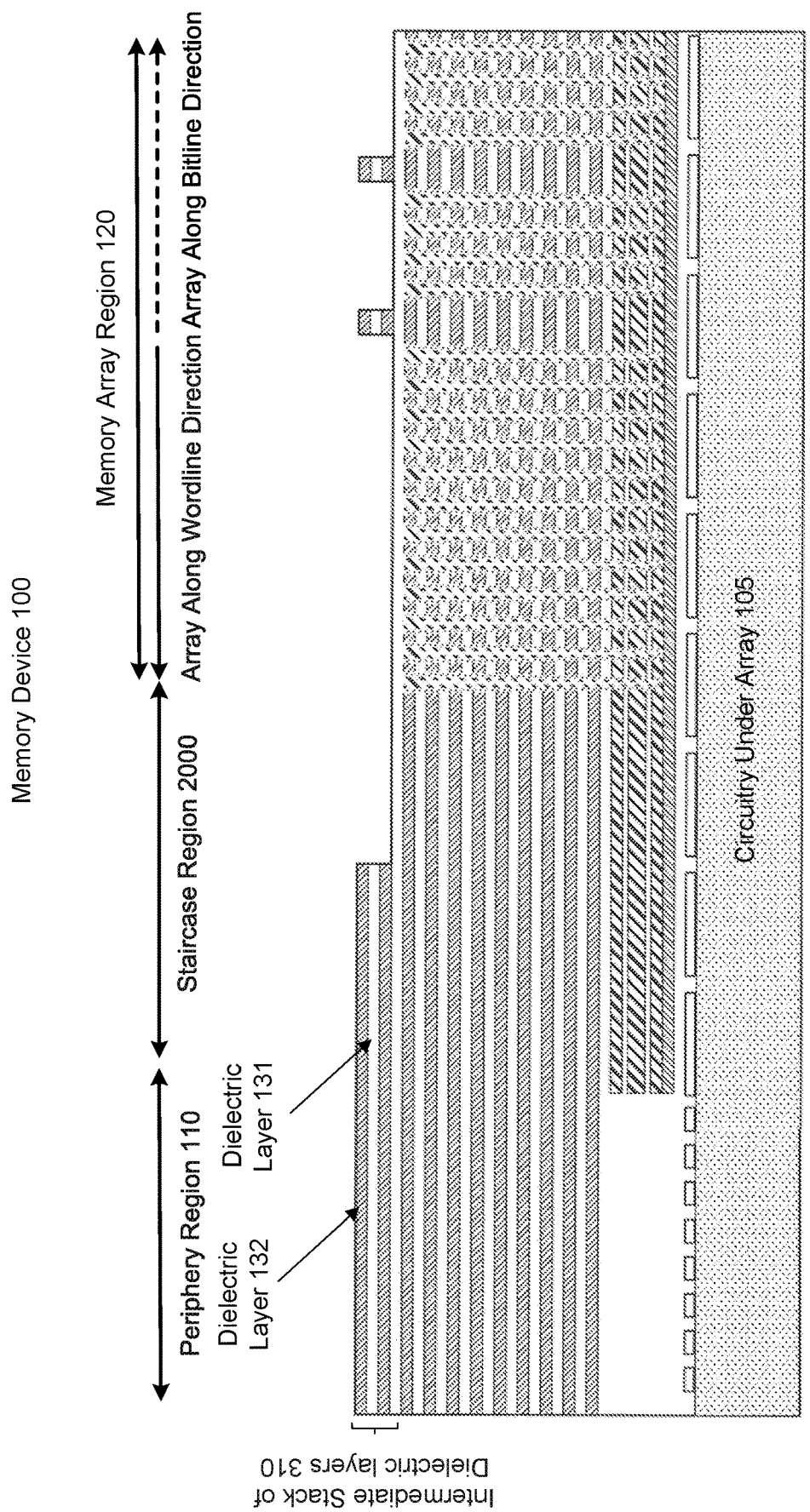

FIG. 6 is a schematic that illustrates a cross-sectional side view of a portion of the example memory device 100 after etching. In this step, the intermediate stack of dielectric layers 310 are etched using the patterned photoresist 410 as a mask. As shown in FIG. 6, one or more dielectric layers of the intermediate stack of dielectric layers 310 that are not covered by the photoresist 410 are etched away and the patterns of the photolithography mask is transferred to the intermediate stack of dielectric layers 310. The photoresist 410 is stripped after the etching.

In particular, the exposed portions of the intermediate stack of dielectric layers 310 can be etched, e.g., with an anisotropic etch (e.g., reactive ion etch (RIE)). In this example, a pair of the dielectric layers 131 and 132 and the second dielectric layer, e.g., silicon nitride layer are etched. Additionally, the depth of etching on the intermediate stack of dielectric layers 310 can be controlled by selectively etching the dielectric stack pair layers to stop on a specific layer of the dielectric layers. The etch stop can be achieved by a time based etch or an end point detection control during the etching. After the etching step, portions of the intermediate stack of dielectric layers 310 may remain over the staircase region 2000. Portions of the intermediate stack of dielectric layers 310 (shown in array along bit line direction) may remain over some areas of the memory array region 120 to enable subsequent slits formation.

Figure 7:
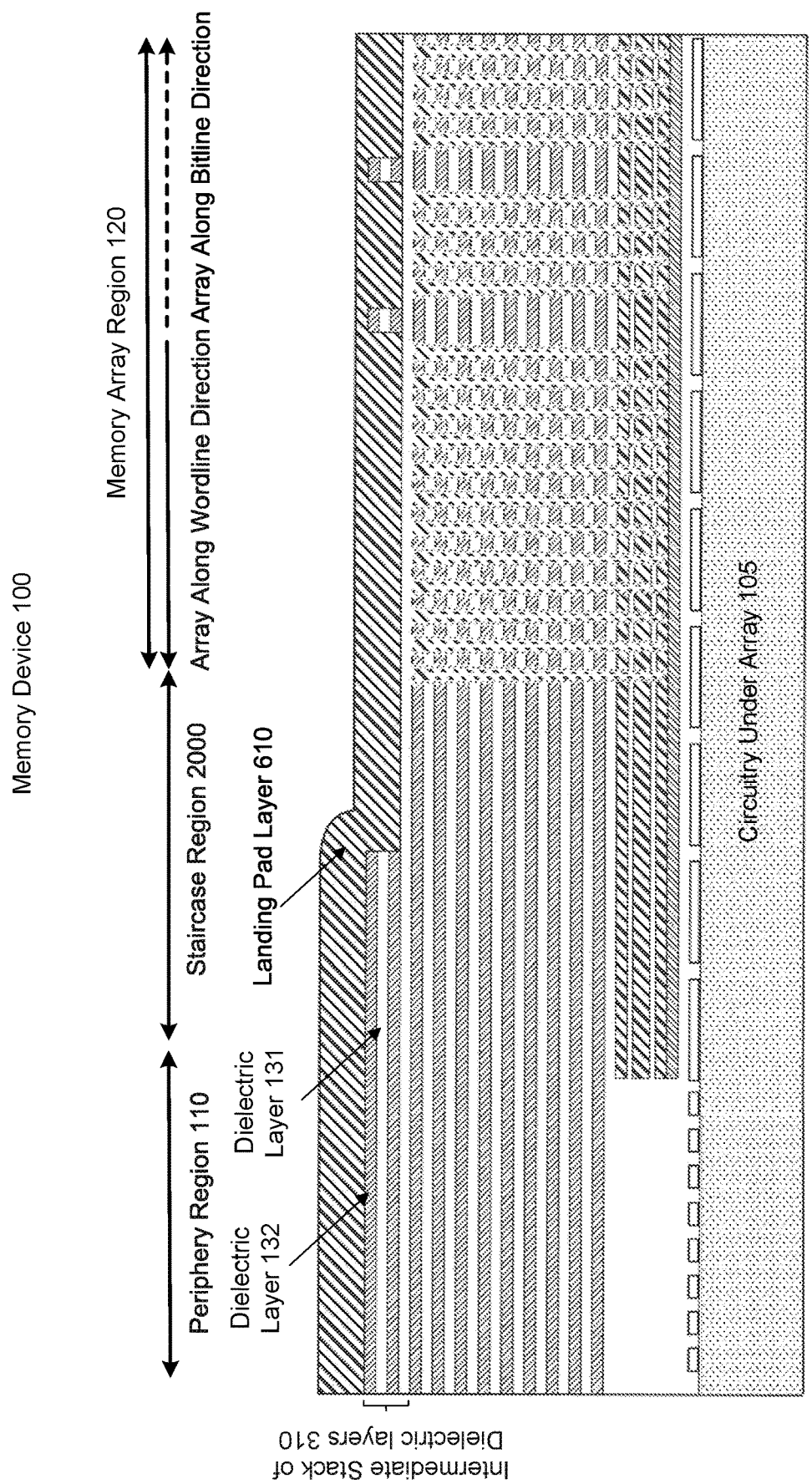

FIG. 7 is a schematic that illustrates a cross-sectional side view of a portion of the example memory device 100 after deposition of the landing pad layer 610. In this step, a landing pad layer 610, e.g., a polysilicon layer, is deposited over the etched intermediate stack of dielectric layers 310 and in the periphery region 110, the staircase region 2000, and the memory array region 120. The deposited landing pad layer 610 has a thickness greater than that of the intermediate stack of dielectric layers 310, so that it conformally covers the edge depth of the etched intermediate stack of dielectric layers 310. The material of the landing pad layer can include, for example, polysilicon, tungsten, silicon nitride, silicon oxide, silicon oxynitride, high-K dielectric materials, and silicide (e.g., CoSi, TiSi, or NiSi), among other materials.

Figure 8:
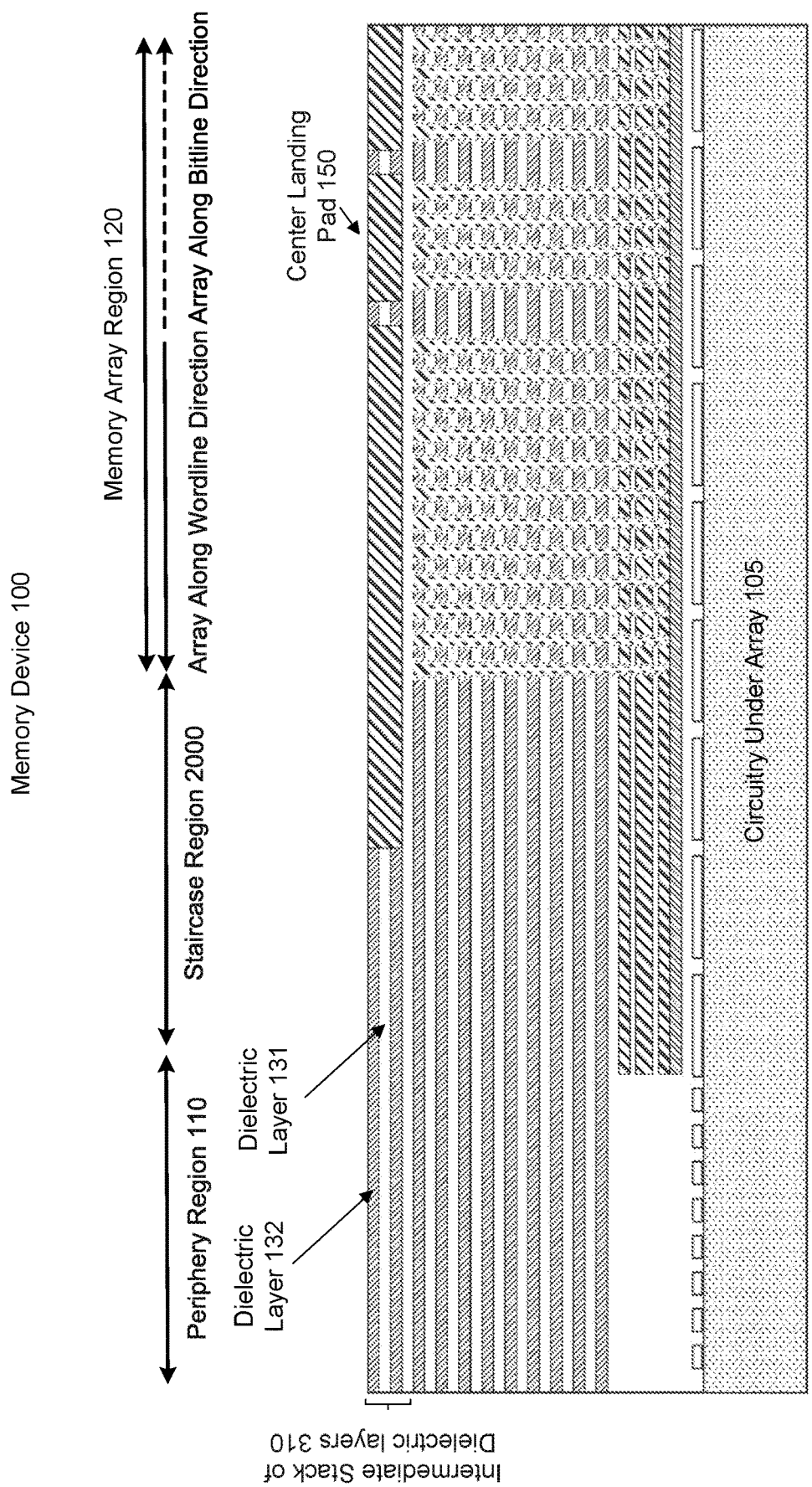

Following the deposition of the landing pad layer 610 is a planarization step to planarize the deposited landing pad layer 610 until a top surface of the underlying intermediate stack of dielectric layers 310 is exposed. This planarization can be performed with a polishing process, e.g., chemical mechanical polishing. The portion of the landing pad layer 610 remaining in the trenches in the intermediate stack of dielectric layers 310 provides the center landing pad 150 as shown in FIG. 8.

Figure 9:
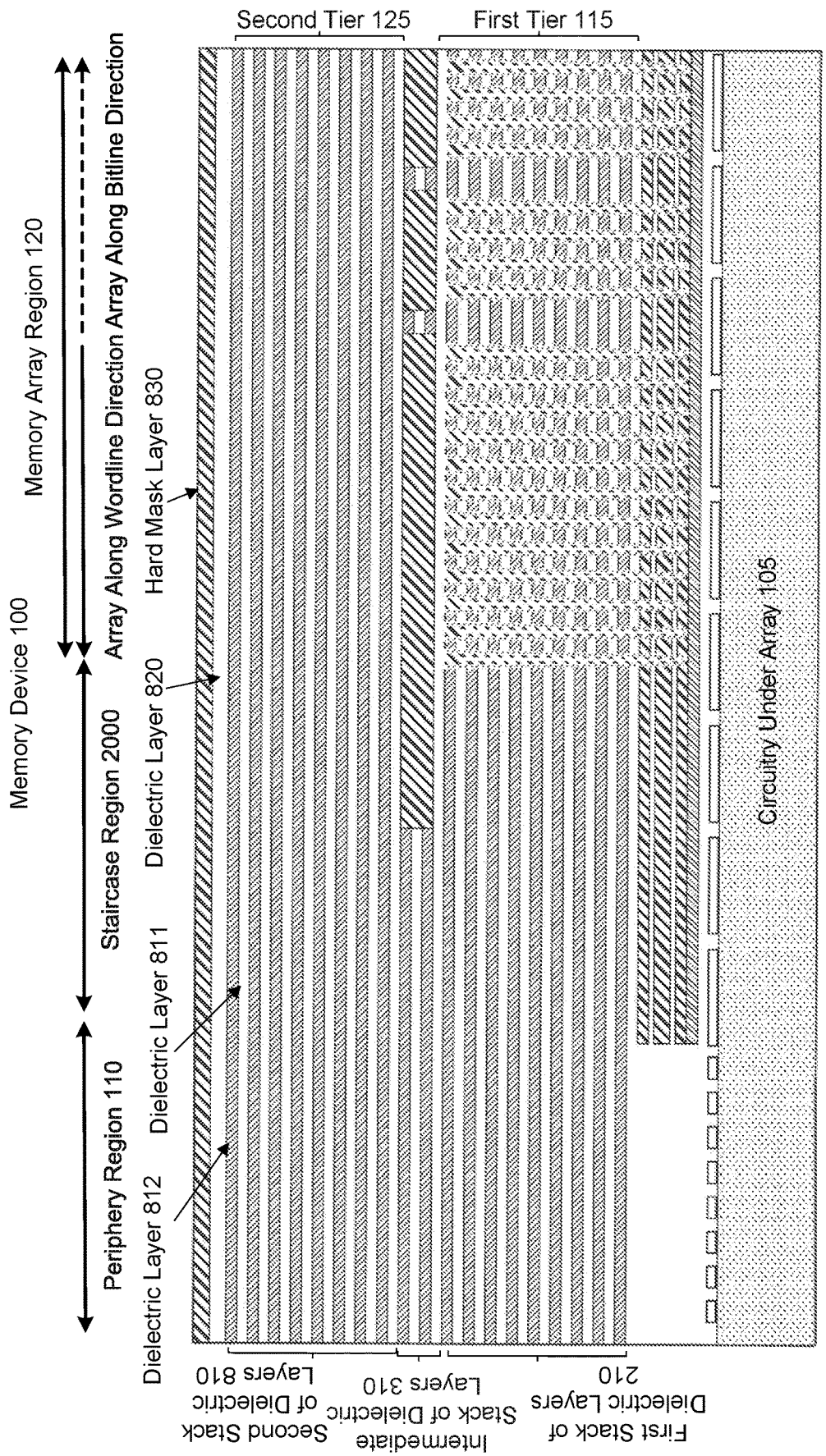

After the formation of the center landing pad 150, the second tier 125 of the memory array is fabricated over the substrate and is vertically aligned with the first tier 115. In some example, the center landing pad 150 is located between two adjacent tiers, e.g., the first tier 115 and the second tier 125, of a plurality of tiers. FIG. 9 is a schematic that illustrates a cross-sectional side view of a portion of the example memory device 100 after forming the second stack of dielectric layers 810. In this example, the second stack of dielectric layers 810 including alternating dielectric layers 811 and 812 of different composition, e.g., alternating layers of a nitride material and an oxide material, are deposited. In particular, the alternating dielectric layers 811 and 812 include an upper dielectric layer 812 of the same composition as the upper dielectric layer 132 in the first tier 115, and a lower dielectric layer 811 of the same composition as the dielectric layer 131 in the first tier 115. For example, the alternative dielectric layers 811 and 812 can be silicon oxide and silicon nitride layers, respectively, similar to that of the first stack of dielectric layers 210.

The deposition conditions and the thickness of the alternative dielectric layers in the first and second stacks of dielectric stack layers 210 and 810 can be identical. In some other implementations, the second dielectric layers stack 801 may include different pairs of the dielectric stack layers, as compared to that of the first stack of dielectric layers 210.

Above the second stack of dielectric layers 810, a dielectric layer 820, e.g., a silicon oxide layer, and a hard mask layer 830, e.g., a polysilicon layer, are deposited. The dielectric layer 820 covers the top dielectric layer 812, e.g., the top silicon nitride layer, which later will be converted to a conductive gate layer on the top of the memory array region 120. The hard mask layer 830 will serve as a hard mask layer for the staircase formation in following procedures. In this example, the peripheral region 110 includes the first, the intermediate, and the second stacks of dielectric layers 210, 310, and 810.

In some examples, the alternative dielectric layers in the first, the intermediate, and the second stacks of dielectric layers comprise one of a pair of silicon oxide and silicon nitride layers, a pair of silicon oxide and poly silicon layers, a pair of silicon nitride and poly silicon layers, a pair of silicon oxide and tungsten layers, or a tuple of silicon oxide, silicon nitride, and poly silicon layers.

Figure 10:
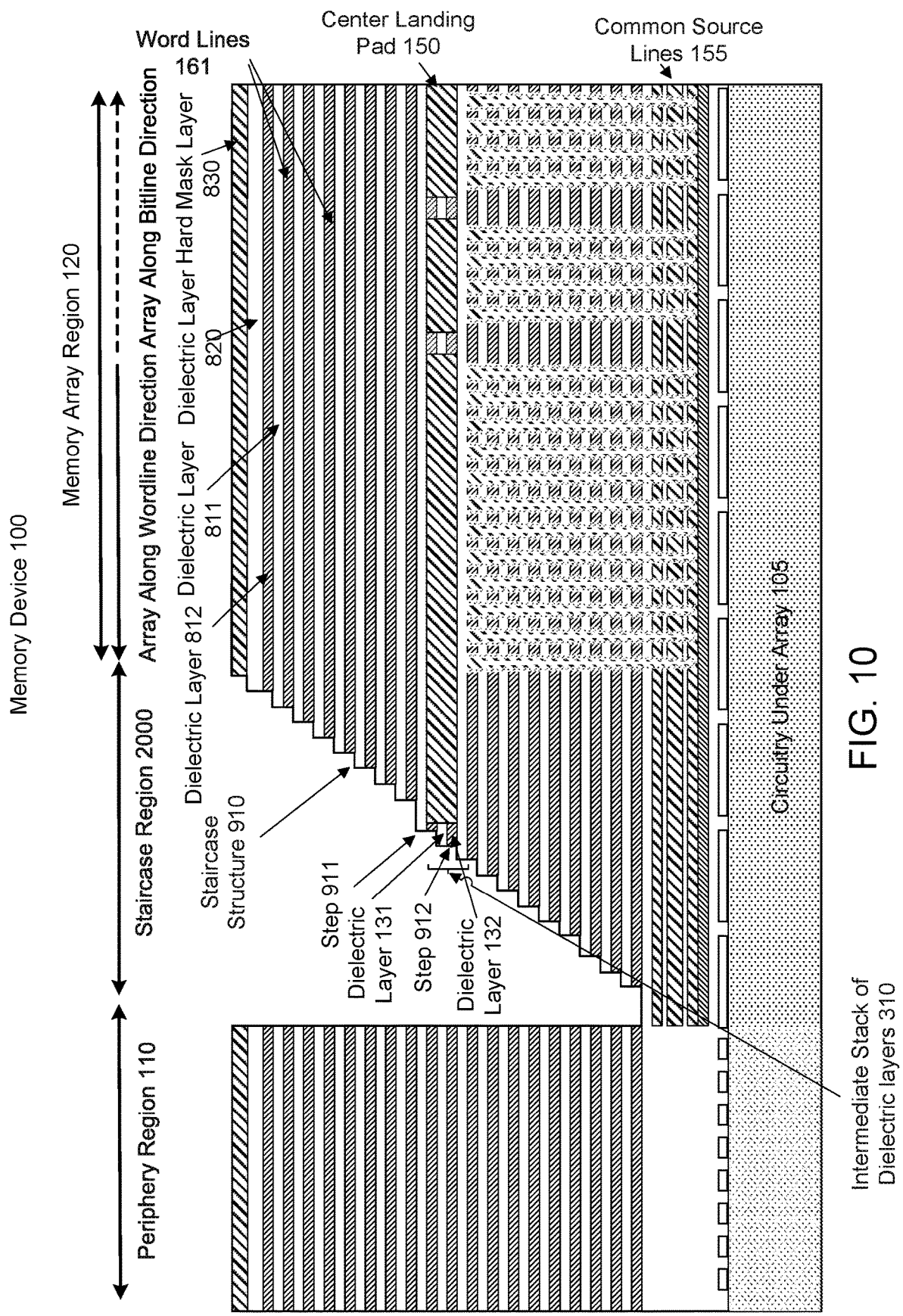

FIG. 10 is a schematic that illustrates a cross-sectional side view of a portion of the example memory device 100 after formation of the staircase. In this example, the staircase is etched through the second stack, the intermediate stack, and the first stack of dielectric layers 810, 310, and 210, in the staircase region 2000. This staircase formation exposes the end of each upper dielectric layers 132 and 812 to enable later formation of vertical contacts. The staircase is fabricated by multiple cycles of etching the alternating dielectric layers using the patterned photoresist and two-dimensional (2D) trimming of the patterned photoresist. This step requires precise etch step profiling, trim etch uniformity and pull-back critical dimension control for word lines contact.

As shown in FIG. 10, the hard mask layer 830 is firstly patterned to generate an opening for etching of the staircase region 2000. The steps in the staircase are generated by repeatedly applying etch on the dielectric stack layers and applying trim on the patterned photoresist, and eventually close to the common source lines 155. In this example, a directional etching may be conducted along the trimmed photoresist and through the second, the intermediate, and the first stacks of dielectric layers in the staircase region 2000. The etching step maybe performed by an anisotropic directional etching technique (e.g., a RIE) on one pair of stack dielectric layers, for example, a pair of silicon nitride and silicon oxide layers. This etching does not react with other exposed materials within the staircase region 2000 and thus creates uniform staircase. The trimming step may be conducted by a 2D trimming technique (e.g., a dry etch) to trim the patterned photoresist in horizontal directions. The trimming step may also be conducted by a minimal incremental layer cost trimming on the patterned photoresist located above the staircase region 2000. In some other implementations, the staircase etching is conducted by the photoresist 2D trimming and vertical etching of multiple pairs of stack dielectric layers.

During the formation of the staircase, the center landing pad 150 remains completely embedded horizontally in the one or more pairs of dielectric layers of the intermediate stack of dielectric layers 310. Consequently, the center landing pad 150 is not exposed to the trimming and etching processes. In this regard, only the alternating dielectric stack layers are exposed to the cyclic trimming/etching steps, and therefore, the steps of the staircase generated for the pairs of dielectric stack layers can be extremely uniform. Additionally, during the staircase formation, the stacked layers region in the periphery region 110 and the memory array region 120 remain covered by the hard mask layer 830 and thus, not affected by the trimming and etching processes thereof. In this example, the staircase may be formed as a continuous staircase structure 910, i.e., the staircase has an uninterrupted sequence of steps. The steps of the staircase can be uniformly spaced apart laterally in the staircase region 2000. Similarly, the steps of the staircase can be uniformly spaced vertically in the staircase region 2000.

In this example, the staircase includes two steps located adjacent to one end of the center landing pad 150. Specifically, as shown in FIG. 10, two steps 911 and 912 are located adjacent one end of the center landing pad 150. Each of the steps includes a pair of dielectric layers 131 and 132, and one of the dielectric layers, e.g., the sacrificial dielectric layer 132, would be selectively removed and filled by conductive gate materials in following processing procedures. In this example, the steps 911 and 912 are formed within a thickness of the center landing pad 150. As described earlier, the thickness of the center landing pad 150 relates to a thickness of the intermediate stack of dielectric layers 310 and the etching step thereon. In some implementations, there may be more than two steps that are located adjacent to the one end of the center landing pad 150. In some other implementation, there may be a plurality of center landing pads located between the plurality of tiers in the memory array region 120.

In this example, a top surface and a bottom surface of the center landing pad 150 are coplanar with two respective transition interfaces between dielectric layers in the periphery region 110. For example, the top surface and the bottom surface of the center landing pad 150, as shown in FIG. 10, are coplanar with a transition interface between the intermediate stack of dielectric layers 310 and the second stack of dielectric layers 810, and a transition interface between the first stack of dielectric layers 210 and the intermediate stack of dielectric layers 310, respectively.

Figure 11:
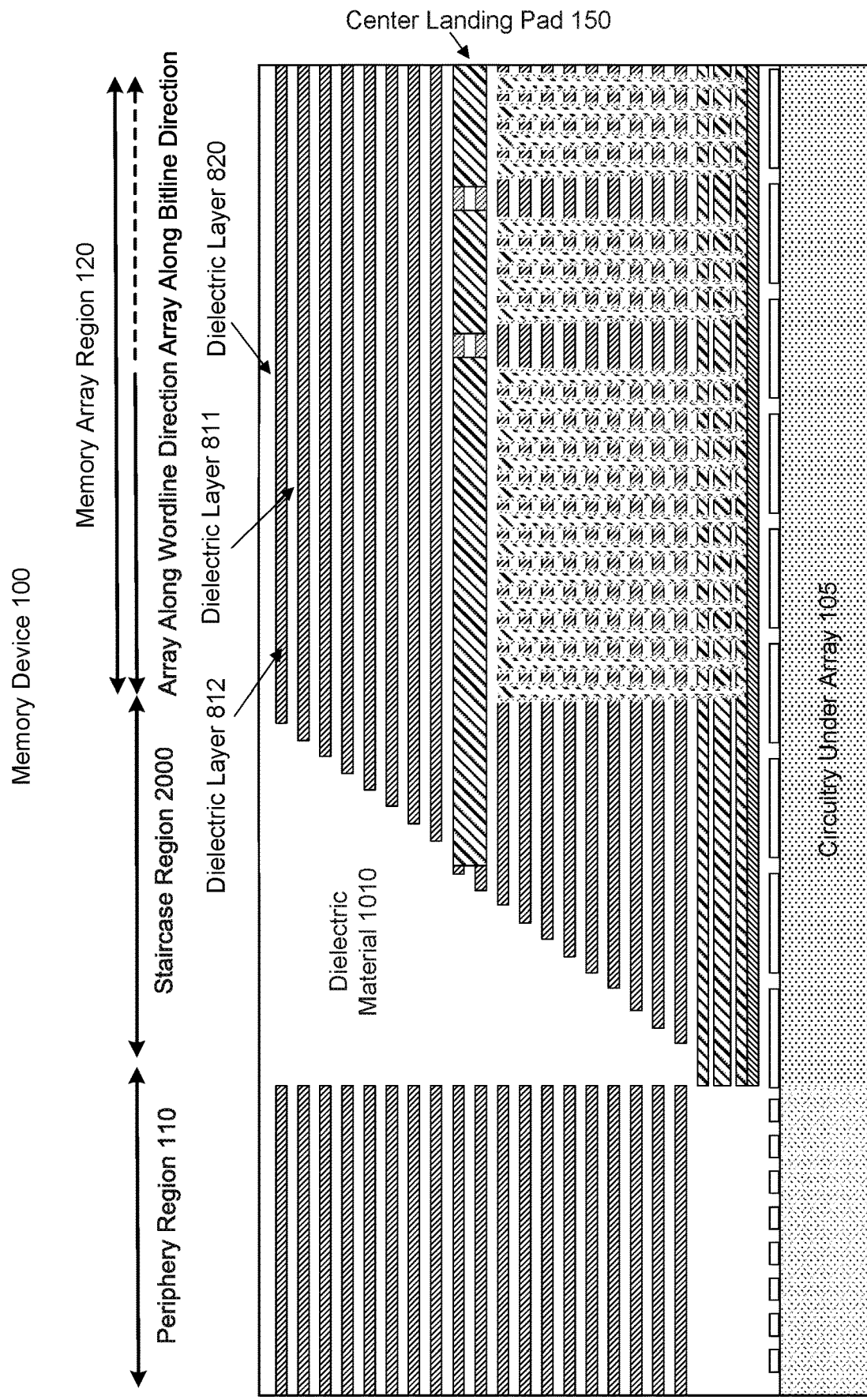

FIG. 11 is a schematic that illustrates a cross-sectional side view of a portion of the example memory device 100 after the inter layer dielectric filling in the staircase region 2000. In this step, dielectric materials 1010, for example, silicon oxide is deposited on the memory device 100 to fill the open space above the etched staircase. The dielectric material 1010 may be deposited by a chemical vapor deposition (CVD) technique and can be subsequently planarized to form a planarization silicon oxide surface on the memory device 100. Other materials may be used instead of silicon oxide, such as flowable oxide, spin-on dielectrics, or other porous films. The planarization process may be done by a CMP process to polish away the overfilled silicon oxide above the poly silicon hard mask layer 830, and stop the planarization on the poly silicon hard mask layer 830. After the planarization, the poly silicon hard mask layer 830 is removed, for example, by a wets etching process.

FIGS. 12-17 are cross-sectional side views of the example memory device 100 in FIG. 1, to show the process for manufacturing the second tier memory array and conductive gate layers.

Figure 12:
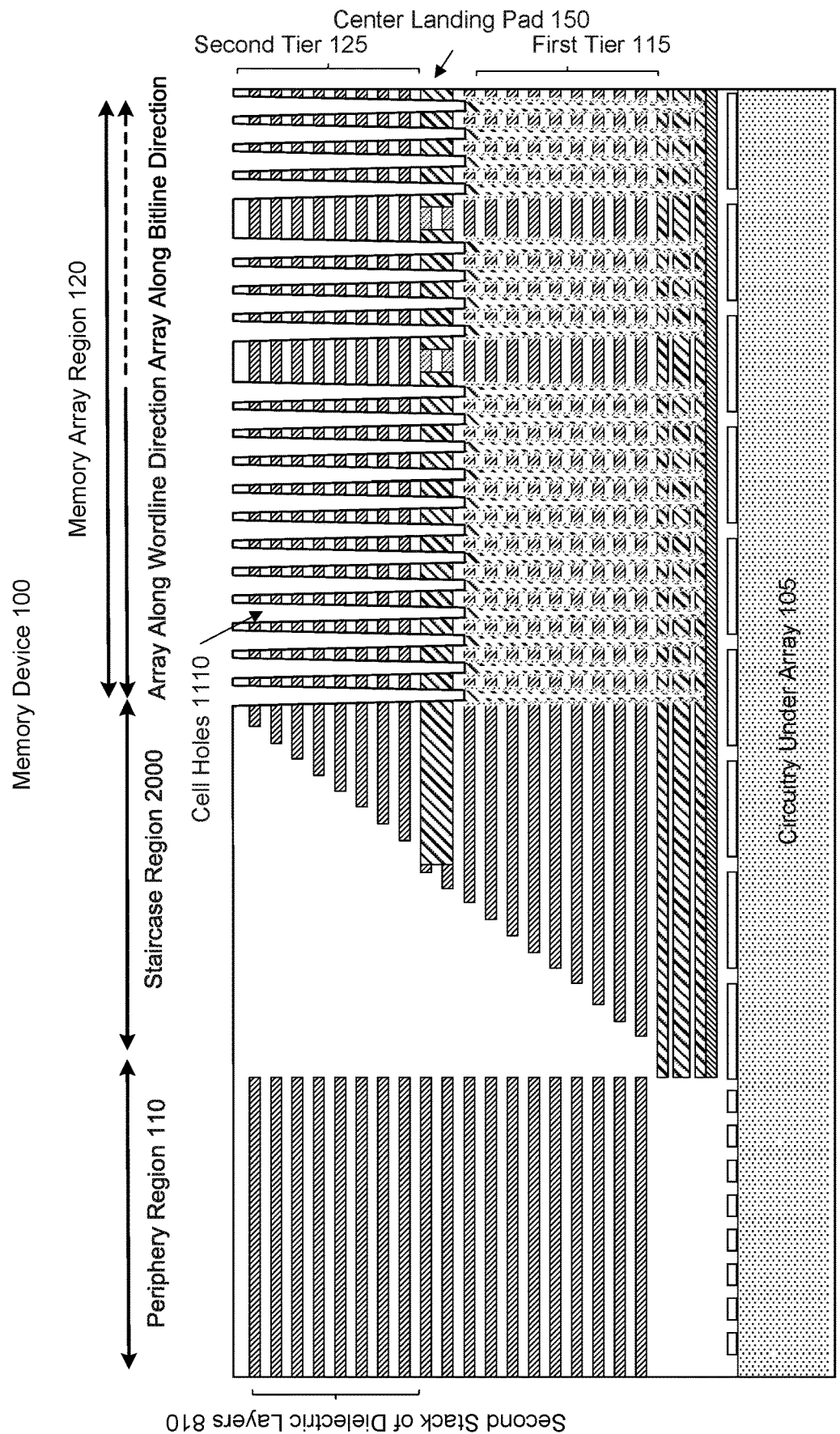

As shown in FIG. 12, memory cell holes 1110 are etched downwards through the second stack of dielectric layers 810 by a high aspect ratio etching technique. In general, the channel hole etch relates to both the high aspect ratio structure of the cell holes and the different materials involved in the word lines stack. The aspect ratio for a multi-tiers 3D NAND memory holes maybe more than 40:1, against the 10:1 for a planar NAND memory device. In this example, the vertical cell holes etching is conducted on a single tier, e.g., the second tier 125 with limited memory layers and a low aspect ratio of the memory cell holes.

The memory cell holes 1110 are etched through the second stack of dielectric layers 810 in the second tier 125 and the center landing pad 150, and stop on the plug 180 of the first tier 115. In this example, the plurality of memory cell holes 1110 are aligned substantially to memory cell holes in the first tier 115 in the memory array region 120. The etching of the vertical cell holes 1110 include multiple steps, e.g., a first etch step and a second etch step. In this example, the first etch step etches through the second stack of dielectric layers 810 and stops on the center landing pad 150. The second etching step etches through the center landing pad 150 and stop on the plug 180 of the first tier 115. The first and second etch steps may involve different etching chemistries with various etch selectivity between the dielectric stack layer materials and plug material. In this example, the memory cell holes etching may be conducted by using advanced plasma etch technologies (e.g., a RIE etch). The stacked multiple-tier memory arrays structure is fabricated by sequentially etching cell holes of each memory tier with limited memory cell layers there in and low etch aspect ratio, and then stacking the memory tiers with center landing pads inserted there between as cell hole etch stop layers.

Figure 13:
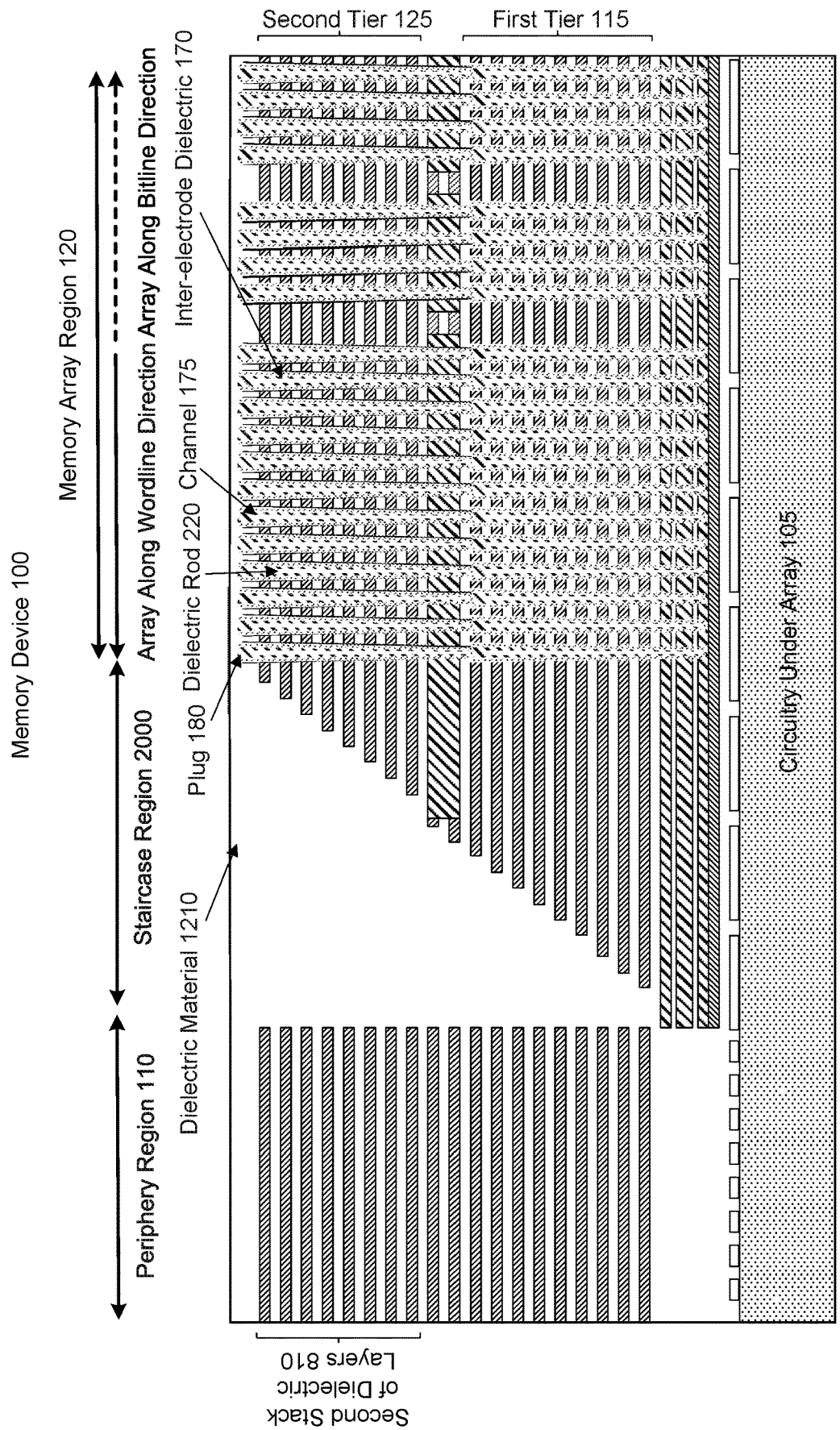

FIG. 13 is a schematic that illustrates a cross-sectional side view of a portion of the example memory device 100 after the memory cell processing in the second memory tier. In this example, a plurality of memory cells are fabricated in the second tier 125 of the memory array region 120. In this step, vertical cylindrical memory holes are first etched through the second stack of dielectric layers 810 and then form inter-electrode dielectric 170 and the conductive channel layer 175. The inter-electrode dielectric 170 may include a multiple layer film, e.g., silicon oxide-silicon nitride-silicon oxide (ONO) multiple layers, and is deposited on interior sidewalls and bottom surface of the memory cell holes 1110. In this example, the first and the second silicon oxide layers in the inter-electrode dielectric 170 perform as tunnel oxide and blocking oxide respectively, and the silicon nitride layer in inter-electrode dielectric 170 serves as charge trap (CT) material. A portion of the inter-electrode dielectric 170 is deposited on the bottom surface of the cell holes and then removed, for example, by a directional touch up etch (e.g., a ME). A conductive vertical channels 175, e.g., formed of polysilicon, are deposited along the internal surface of the inter-electrode dielectric 170. As shown in FIG. 13, each of the memory cell holes includes the dielectric rod 220, e.g., a silicon oxide rode, as a core filler inside the polysilicon channel layer 175 and capped by the plug 180 formed there above. Once the memory cells of the second tier 125 are processed, dielectric material 1210, e.g., silicon oxide, is deposited on top of the memory device 100 and followed with a CMP process to planarize the surface of the memory device 100.

Figure 14:
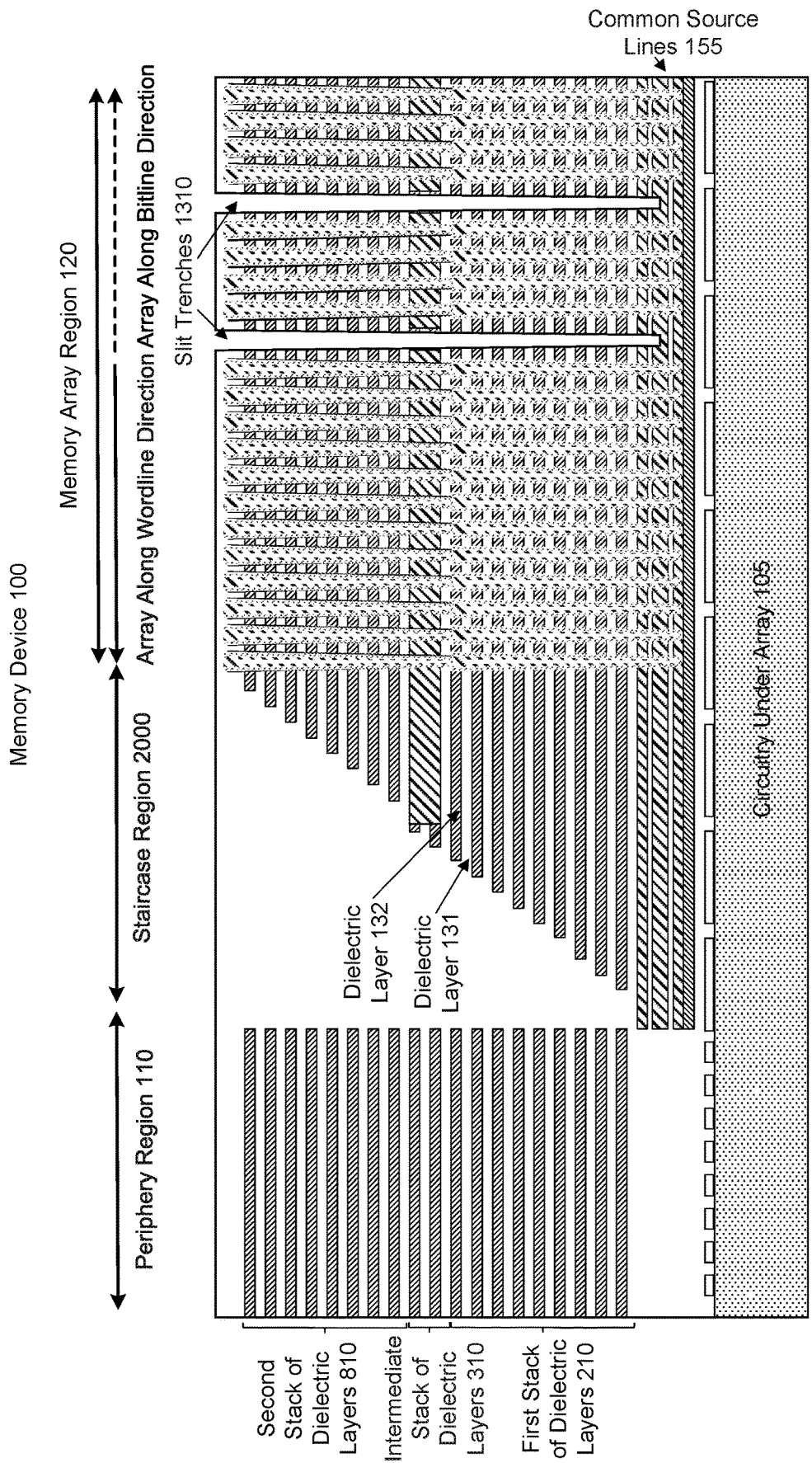

FIG. 14 is a schematic that illustrates a cross-sectional side view of a portion of the example memory device 100 after slit trenches 1310 are etched. In order to minimize disturbances, blocks of memory cell holes are separated from each other by creating a plurality of slit trenches 1310. The etching to form the plurality of slit trenches 1310 extends through the second and the first tiers in memory array region 120 and stops at the common source lines 155. As shown in FIG. 14, the slit trenches 1310 are spaced apart along the bit lines direction. The slit trenches 1310 penetrate the remained portions of the intermediate stack of dielectric layers 310 (shown in array along bit line direction) over some areas of the memory array region 120 as previously mentioned. Each slit trenches extends along the word lines direction and past multiple memory cells of the multi tiers.

The slit trenches 1310 provide open spaces for the formation of replacement gate layers and the slits for electrically interconnection. The etching of the slits may be done by an anisotropic etching technique (e.g., a ME) and it is less challengeable as compared to the vertical cell holes etching considering that the slit trenches provide more space in word line direction for etching chemistries to flow in and residual materials to flow out.

Figure 15:
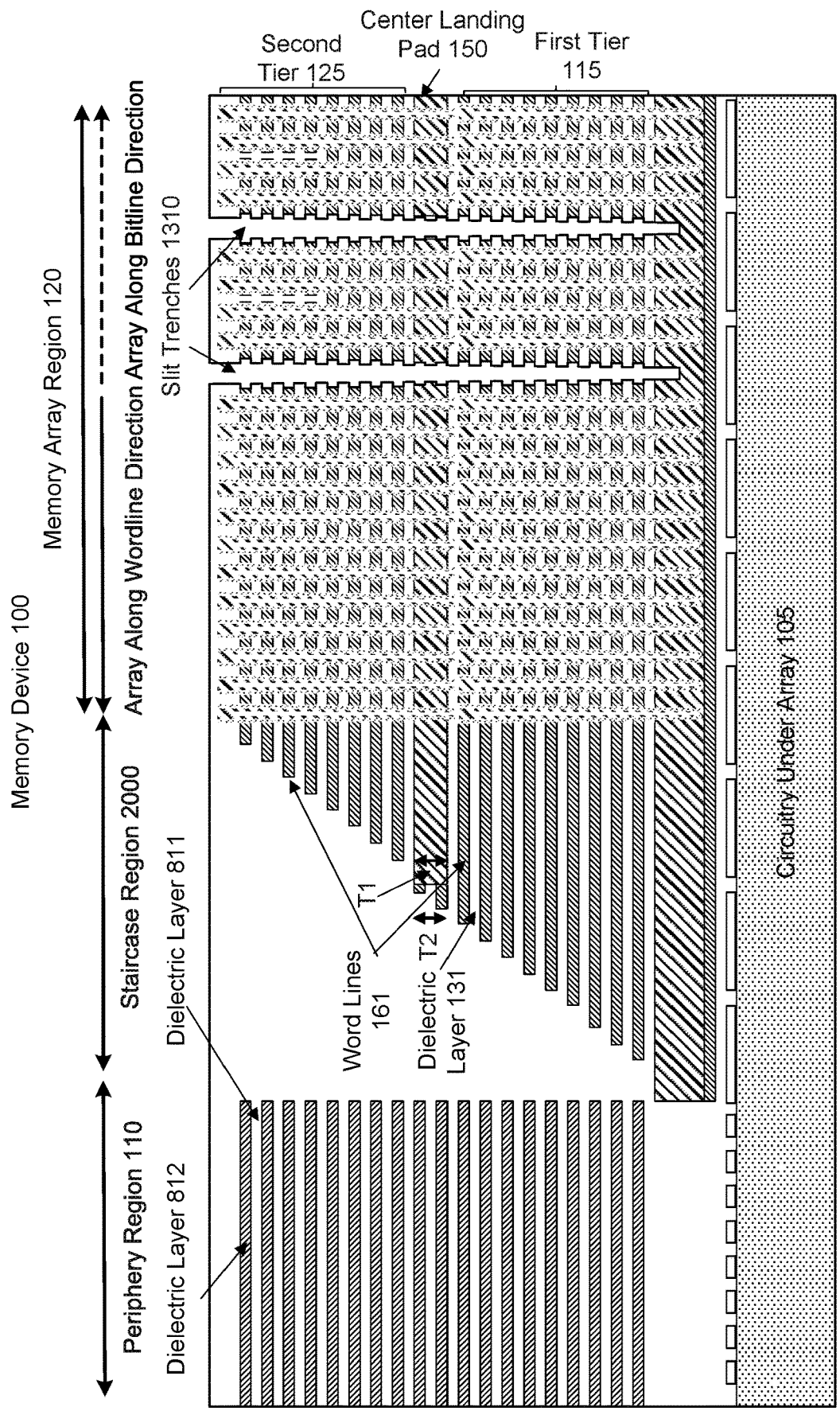

FIG. 15 is a schematic that illustrates a cross-sectional side view of a portion of the example memory device 100 after replacement gate formation. In this example, the conductive gate layers is formed by selectively removing one type of dielectric layers from the first, the intermediate, and the second stack of dielectric layers in the memory array region 120 and the staircase region 2000. Specifically, as shown in FIG. 15, the dielectric layers 132 and 812, for example, the silicon nitride layers in the dielectric layer stacks are removed, and then the space is refilled with a plurality of gate layers. Once the slit trenches 1310 are opened, the dielectric layers 132 and 812, e.g., the silicon nitride layers, that are exposed on the sidewall of the slit trenches 1310 are then subjected to an etch process (e.g., a dry etch) that is highly selective to the dielectric layers 131 and 811, e.g., silicon oxide, and the landing pad layer 610, e.g., polysilicon. As a result, very little portion of the center landing pad 150 and the common source line 155 is removed during the etch process. In this step, the etch process removes the one type of dielectric layers from the first, the second, and the second stack of dielectric layers in the memory array region 120 and the staircase region 2000 to form openings and continues until the sacrificial material in the staircase region 2000 and memory array region 120 is complete removed.

A plurality of gate layers are then filled, through the exposed openings in the sidewalls of the slit trenches, by a deposition technique with good filing capability in small features, e.g., a low fluorine tungsten ALD process, to deliver conductive gate materials into the plurality of gate layers. In this example, a plurality of void-free gate layers can fill the lateral space of dielectric stack layers with minimal stress on the memory array region 120. Additionally, the gate layer material has to be different to the alternative dielectric stack materials, and may be selected from metals, doped poly silicon, and other materials.

The laterally filed gate layers, in this disclosure, serve as word lines 161 and are configured for selecting and functioning memory cells in the memory array region 120. As shown in FIG. 15, the gate layers replace the sacrificial layers in the staircase region 2000. In particular, there are two steps in the gate staircase formed adjacent an end of the center landing pad 150. Depending on the dielectric stack layers thickness and the center landing pad 150 thickness, there may be more than two gate steps formed adjacent the end of the center landing pad 150. In this example, the staircase 101 includes portions of the plurality of work lines 161 that extend from the memory array region 120.

Furthermore, as a contrast, in the periphery region 110, the alternative dielectric layer stack maintains the alternating dielectric stack structure and is not affected by the formation of the gate layers.

It has been determined that it can be advantageous, in some implementations, to construct the memory devices described herein, specifically the staircase of the memory devices so that certain features have dimensions that fall within particular ranges. For example, when the replacement gate layers are formed with the staircase, the thickness T1 of the center landing pad 150 should be equal to a sum thickness T2 of the dielectric stack layers. For instance, a dielectric stack layer includes a silicon oxide layer and a silicon nitride layer, and the center landing pad thickness T1 equals a sum thickness of two pairs of the dielectric stack layers.

In some other implementations, the thickness T1 of the center landing pad 150 may be equal to a sum thickness T2 of dielectric stack pair layers and other layers. For instance, a dielectric stack layer includes a silicon nitride layers and a silicon oxide layer, and the center landing pad thickness T1 equals to a sum thickness of one pair of the stack layers and one more silicon nitride layer. In another example, a dielectric stack layer includes a silicon nitride layers and a silicon oxide layer, and the center landing pad thickness T1 equals to a sum thickness of two pairs of the stack layers and one more silicon nitride layer. In another example, a dielectric stack layer includes a silicon nitride layer and a silicon oxide layer, and the center landing pad thickness T1 equals to a sum thickness of two pairs of the stack layers and one more poly silicon layer.

Figure 16:
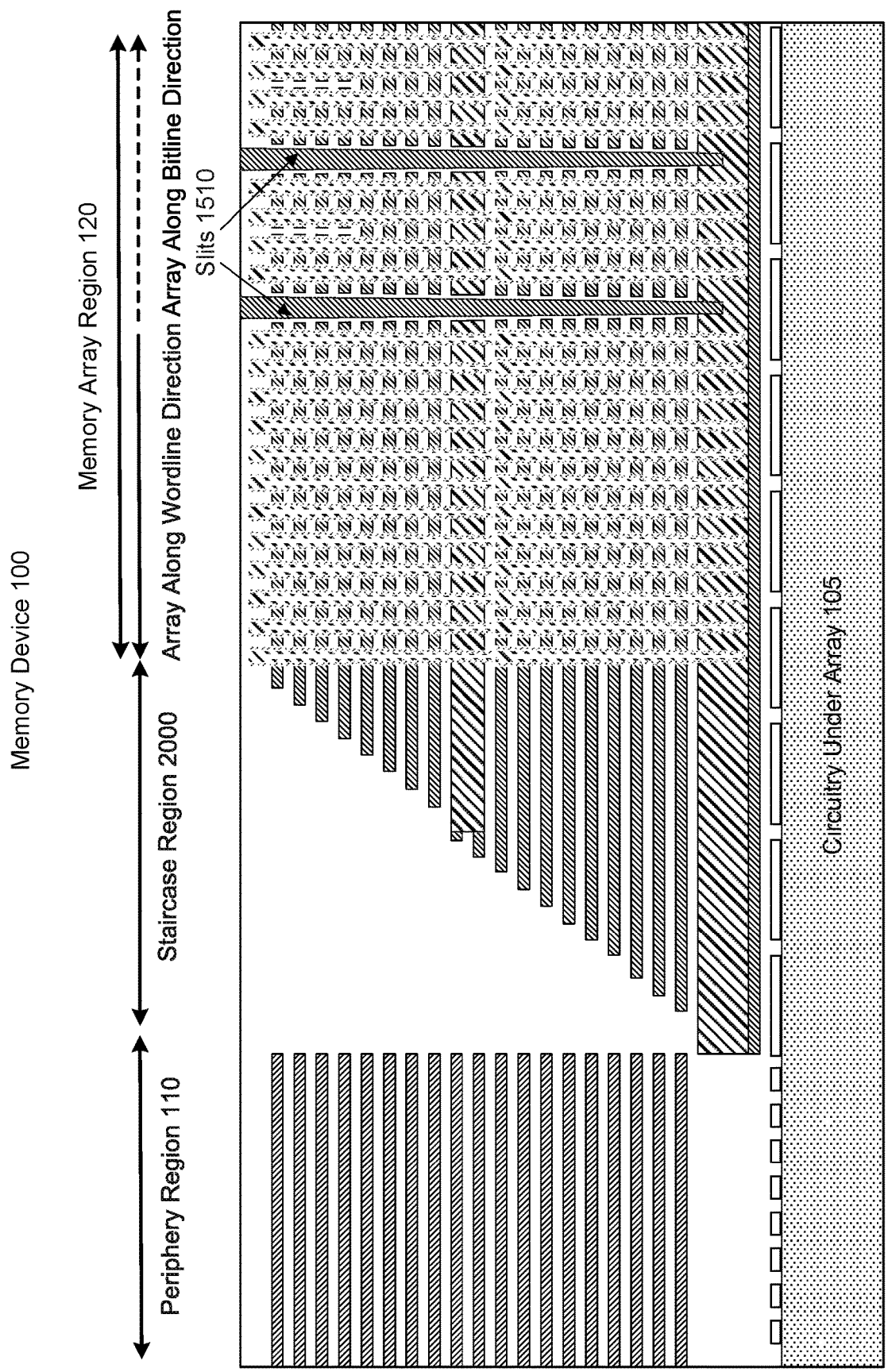
Figure 17:
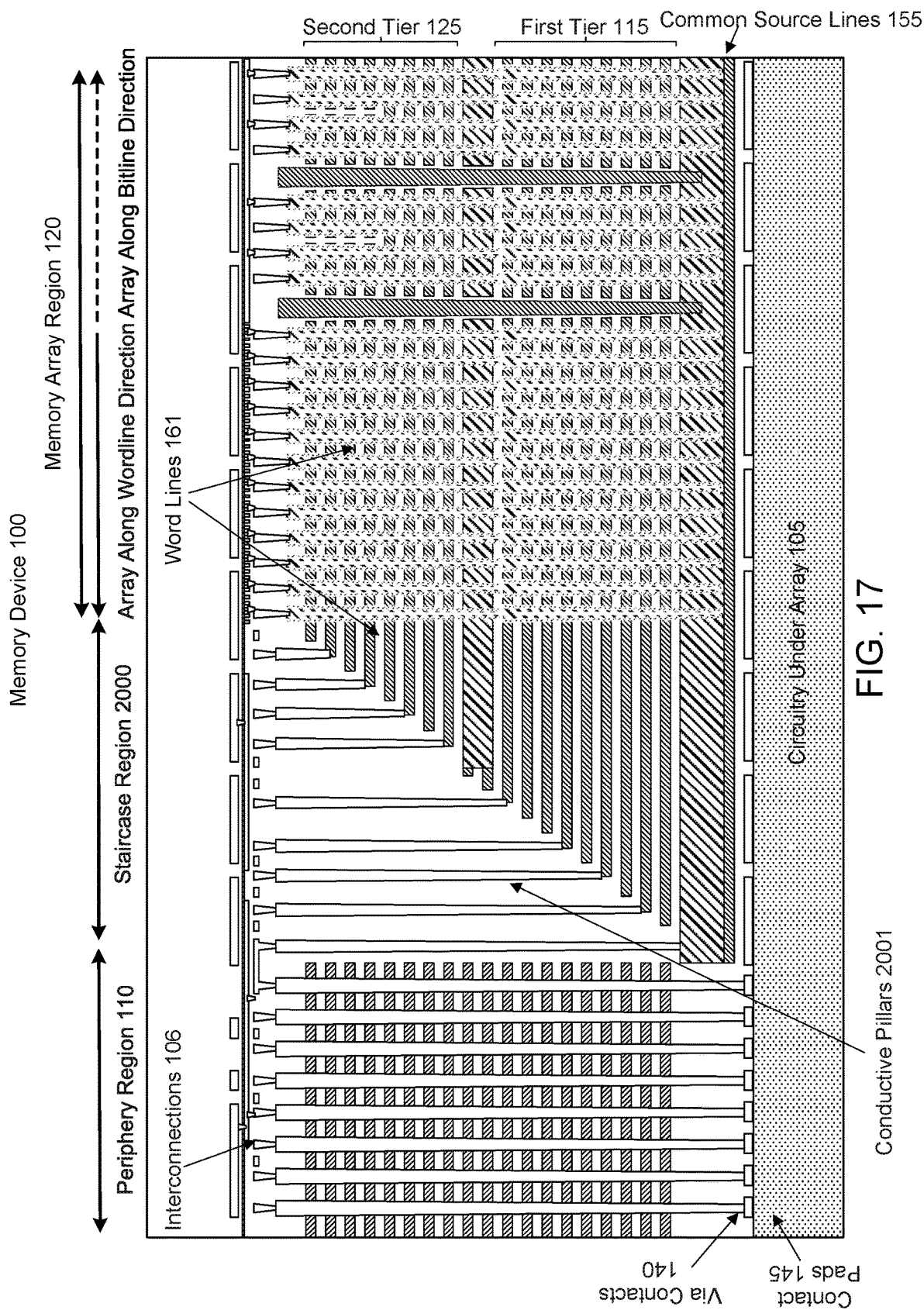

FIGS. 16 and 17 are schematics that illustrate cross-sectional side views of the example memory device 100 after slit deposition and interconnections formation. The conductive slits 1510 are formed by depositing conductive materials to the plurality of slit trenches 1310 and then planarizing the top surface of the memory array region 120. Thereafter the plurality of via contacts 140 are formed in the periphery region 110 and penetrate downwards through the multiple stacks of dielectric layers in the periphery region 110, as shown in FIG. 17. Multiple patterning steps may be used to generate via holes in different regions of the memory device and to fill the via holes with conductive material to form the via contacts 140. In the staircase region 2000, the plurality of conductive pillars 2001 are connected with the staircase 101 by extending from the interconnections 106 to one end of the plurality of word lines 161, wherein the staircase performs as one end of the word lines 161. Over the top of the second tier 125, the plurality of interconnections 106 including bit lines are fabricated by BEOL processes. The interconnections 106 include contact plugs (not shown), metal lines (not shown) and bit lines (not shown) in a same level or different levels. The interconnections 106 may connect different components in the periphery region 110, the staircase region 2000, and the memory array region 120. In this example, the plurality of interconnections 106 are connected with the plurality of memory cells in the memory array region 120 through the plurality of conductive pillars 2001 and the plurality of word lines 161 in the staircase region 2000. The bit lines are orthogonal to the word lines 161. In this example, each memory string of cells is electrically connected to a bit line, whereas the bottom of the memory string of cells is connected to the common source lines 155 formed under the first tier 115 of the memory array. In one embodiment, at least one conductive pillar (not shown) in the staircase region 2000 extends downwards and contacts the center landing pad 150 including conductive material. The conductive material includes polysilicon, tungsten, silicide, or other suitable materials. The conductive center landing pad 150 surrounds a portion of cell holes 1110 (as shown in FIG. 12) and overlaps a portion of the inter-electrode dielectric 170 and the channel layer 175 in each cell hole. The conductive center landing pad 150 acts as control gates of the portion of the channel layer 175 in each cell hole. While the electricity is transmitted through the at least one conductive pillar to conductive center landing pad 150 and turn on the control gates of each cell hole, the ability of flowing current through the channel layer 175 in each cell hole may be enhanced.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device, comprising:
a memory array region that includes a plurality of tiers that are vertically arranged, each tier of the plurality of tiers including:
a plurality of memory cells, and
a plurality of word lines that are respectively coupled to the plurality of memory cells;
a center landing pad located between two adjacent tiers of the plurality of tiers;
a staircase region including:
a staircase, wherein the staircase is located adjacent to one end of the center landing pad, and wherein steps of the staircase are formed within a thickness of the center landing pad, and
a plurality of conductive pillars connected with the staircase; and
a periphery region that includes multiple stacks of dielectric layers and a plurality of via contacts penetrating downwards through the multiple stacks of dielectric layers,
wherein a top surface and a bottom surface of the center landing pad are coplanar with two respective transition interfaces between dielectric layers in the periphery region.

2. The memory device of claim 1, wherein the memory device further comprises a circuitry located under the memory array region or adjacent to the memory array region, and wherein the circuitry is configured to control operations of the memory device.

3. The memory device of claim 1, further comprising a plurality of interconnections located on a top portion of the memory device, wherein the plurality of interconnections are respectively connected, through the plurality of conductive pillars and the plurality of word lines in the staircase region, with the plurality of memory cells in the memory array region.

4. The memory device of claim 1, wherein at least one of the conductive pillars extends downwards and contacts the center landing pad including conductive material.

5. The memory device of claim 1, wherein the dielectric layers comprise one of a pair of silicon oxide and silicon nitride layers, a pair of silicon oxide and poly silicon layers, a pair of silicon nitride and poly silicon layers, a pair of silicon oxide and tungsten layers, or a tuple of silicon oxide, silicon nitride, and poly silicon layers.

6. A memory device, comprising:
a periphery region that includes multiple stacks of dielectric layers;
a memory array region that includes a plurality of tiers that are vertically arranged, each tier of the plurality of tiers including:
a plurality of memory cells, and
a plurality of word lines that are respectively coupled to the plurality of memory cells;
a staircase region that includes a staircase, wherein the staircase includes portions of the plurality of word lines that extend from the memory array region; and
a center landing pad that is located between the plurality of tiers in the memory array region,
wherein a top surface and a bottom surface of the center landing pad are coplanar with two respective transition interfaces between dielectric layers in the periphery region, and
wherein the staircase is located adjacent to one end of the center landing pad, and steps of the staircase are formed within a thickness of the center landing pad.

7. The memory device of claim 6, wherein a thickness of the center landing pad equals to a sum of thicknesses of one or more consecutive dielectric layers in the periphery region.

8. The memory device of claim 6, wherein one end of the center landing pad is adjacent to one or more steps including gate layer of the staircase in the staircase region.

9. The memory device if claim 6, further comprising a circuitry that is located under the memory array region or adjacent to the memory array region, and that is configured to perform functions including memory cell row and column decoding, bit lines precharge logic reading, sensing amplifiers, or timing control.

10. The memory device of claim 9, further comprising:
a plurality of contact pads located on a top surface of the circuitry;
interconnections located above the peripheral region, the staircase region, and the memory array region; and
a plurality of via contacts that extend through the multiple stack of dielectric layers in the periphery region and that connect the interconnections and the contact pads.

11. The memory device of claim 10, further comprising conductive pillars that extend from the interconnections to one end of the plurality of word lines in the staircase region.

12. The memory device of claim 6, wherein the plurality of word lines are arranged in parallel and are spaced apart along a memory array stacking direction, and wherein the plurality of word lines are configured to perform as control gates of the plurality of memory cells respectively.

13. The memory device of claim 12, further comprising common source lines that are located under the plurality of memory cells,
wherein the common source lines are configured to couple the control gates to the plurality of word lines, and
wherein the common source lines are made of polysilicon and separated by dielectric layers.

14. The memory device of claim 6, wherein the center land pad is made of materials comprising: polysilicon, tungsten, silicon nitride, silicon oxide, silicon oxynitride, high-K dielectric materials, or silicide.

15. The memory device of claim 8, wherein the one or more steps including gate layer of the staircase do not contact any conductive pillar in the staircase region.

\* \* \* \* \*